(12) United States Patent
Seki et al.

(10) Patent No.: US 11,737,281 B2
(45) Date of Patent: *Aug. 22, 2023

(54) SEMICONDUCTOR MEMORY DEVICE

(71) Applicant: Kioxia Corporation, Tokyo (JP)

(72) Inventors: Harumi Seki, Kawasaki (JP); Kensuke Ota, Yokohama (JP); Masumi Saitoh, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 39 days.

This patent is subject to a terminal disclaimer.

(21) Appl. No.: 17/645,133

(22) Filed: Dec. 20, 2021

(65) Prior Publication Data

US 2022/0406796 A1      Dec. 22, 2022

(30) Foreign Application Priority Data

Jun. 17, 2021 (JP) .................................. 2021-100727

(51) Int. Cl.
*H10B 51/30* (2023.01)
*H01L 29/51* (2006.01)
(Continued)

(52) U.S. Cl.
CPC ........... *H10B 51/30* (2023.02); *H01L 29/516* (2013.01); *H01L 29/792* (2013.01); *H10B 43/20* (2023.02); *H10B 43/30* (2023.02); *H10B 51/20* (2023.02)

(58) Field of Classification Search
CPC ........ H10B 43/10; H10B 43/20; H10B 43/30; H10B 51/10; H10B 51/20; H10B 51/30; H01L 29/516; H01L 29/792
See application file for complete search history.

(56) References Cited

U.S. PATENT DOCUMENTS 8,624,316 B2 * 1/2014 Mizushima ....... H01L 29/40117
257/E21.18
10,453,861 B1 10/2019 Dong et al.
(Continued)

FOREIGN PATENT DOCUMENTS

JP       2010056533 A  *  3/2010  ........ H01L 27/11565
JP       2021-125594 A    8/2021
WO    WO-2020079903 A1 *  4/2020

OTHER PUBLICATIONS

Ji, H. et al. "Improvement of Charge Injection Using Ferroelectric Si:HfO$_2$ as Blocking Layer in MONOS Charge Trapping Memory", Journal of The Electron Devices Society, vol. 6, 2018 (5 pages).
(Continued)

*Primary Examiner* — Matthew E Warren
(74) *Attorney, Agent, or Firm* — Oblon, McClelland, Maier & Neustadt, L.L.P.

(57) ABSTRACT

A semiconductor memory device according to an embodiment includes: a semiconductor layer extending in a first direction; a first gate electrode layer; a first insulating layer between the semiconductor layer and the first gate electrode layer; a second insulating layer between the first insulating layer and the first gate electrode layer, the second insulating layer having a first portion containing a ferroelectric material; and a first layer between the first insulating layer and the second insulating layer, the first layer containing silicon, nitrogen, and fluorine, the first layer having a first region and a second region between the first region and the second insulating layer, the first layer having a second atomic ratio of nitrogen to silicon in the second region higher than a first atomic ratio of nitrogen to silicon in the first region, and the first layer having fluorine concentration higher than the second region.

20 Claims, 31 Drawing Sheets

(51) Int. Cl.
*H10B 51/20* (2023.01)
*H10B 43/30* (2023.01)
*H10B 43/20* (2023.01)
*H01L 29/792* (2006.01)

(56) References Cited

U.S. PATENT DOCUMENTS

2009/0261400 A1\* 10/2009 Ozawa .................. H01L 29/513
                                                            438/587
2009/0294828 A1\* 12/2009 Ozawa .................. H10B 43/27
                                                            438/257
2018/0006216 A1\*  1/2018 Kamata .............. G11C 13/0004
2019/0198673 A1   6/2019 Liu et al.
2019/0304986 A1  10/2019 Dong et al.
2019/0304988 A1  10/2019 Dong et al.
2019/0311756 A1  10/2019 Sharma et al.
2021/0083064 A1\*  3/2021 Okada .................... H10B 43/30
2021/0249420 A1\*  8/2021 Seki ....................... H10B 43/10

OTHER PUBLICATIONS

Seki, H. et al. "Further Investigation on Mechanism of Trap Level Modulation in Silicon Nitride Films by Fluorine Incorporation", IEEE International Reliability Physics Symposium 9128224, Apr. 2020 (7 pages).

\* cited by examiner

B-B' CROSS SECTION

A-A' CROSS SECTION

D-D' CROSS SECTION

C-C' CROSS SECTION

F-F' CROSS SECTION

E-E' CROSS SECTION

G-G' CROSS SECTION

H-H' CROSS SECTION

SEMICONDUCTOR MEMORY DEVICE

CROSS-REFERENCE TO RELATED APPLICATION

This application is based upon and claims the benefit of priority from Japanese Patent Application No. 2021-100727, filed on Jun. 17, 2021, the entire contents of which are incorporated herein by reference.

FIELD

Embodiments described herein relate generally to a semiconductor memory device.

BACKGROUND

A three-dimensional NAND flash memory in which memory cells are three-dimensionally disposed realizes a high degree of integration and a low cost. In the three-dimensional NAND flash memory, for example, a memory hole penetrating through a stacked body is formed in the stacked body in which a plurality of insulating layers and a plurality of gate electrode layers are alternately stacked. By forming a charge storage layer and a semiconductor layer in the memory hole, a memory string in which a plurality of memory cells are connected in series is formed. Data is stored in the memory cell by controlling the amount of charge retained in the charge storage layer.

DETAILED DESCRIPTION

Figure 1:
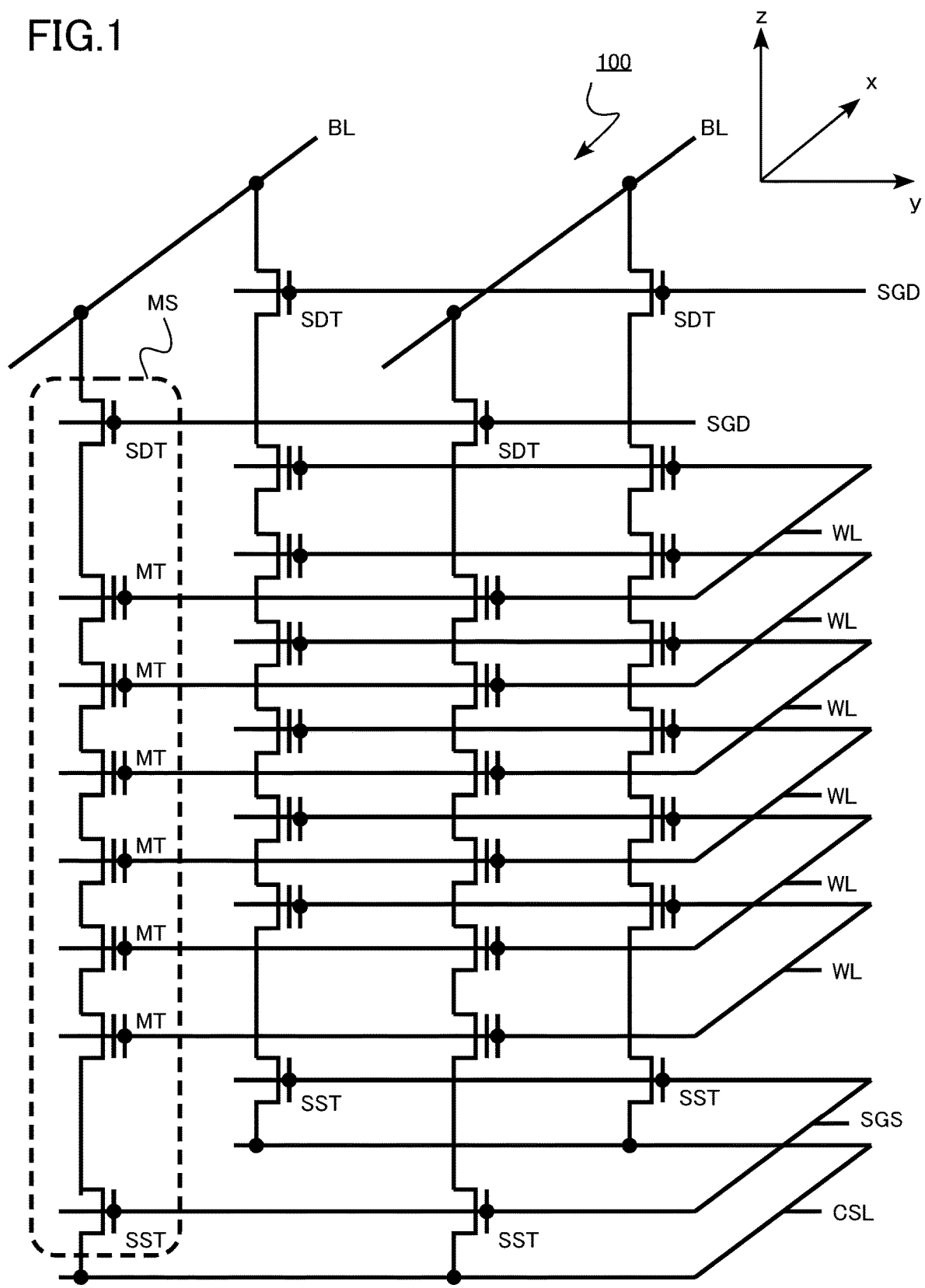
FIG. 1 is a circuit diagram of a memory cell array of a semiconductor memory device according to a first embodiment.

A semiconductor memory device according to an embodiment includes: a semiconductor layer extending in a first direction; a first gate electrode layer; a first insulating layer provided between the semiconductor layer and the first gate electrode layer; a second insulating layer provided between the first insulating layer and the first gate electrode layer, and the second insulating layer including a first portion containing a ferroelectric material; and a first layer provided between the first insulating layer and the second insulating layer, the first layer containing silicon (Si), nitrogen (N), and fluorine (F), the first layer including a first region and a second region provided between the first region and the second insulating layer, a second atomic ratio (N/Si) of nitrogen (N) to silicon (Si) in the second region being higher than a first atomic ratio (N/Si) of nitrogen (N) to silicon (Si) in the first region, and a first fluorine concentration in the first region being higher than a second fluorine concentration in the second region.

Hereinafter, embodiments of the present disclosure will be described with reference to the drawings. In the following description, the same or similar members and the like are denoted by the same reference signs, and a description of the members and the like once described is appropriately omitted.

In the present specification, the term "upper" or "lower" may be used for convenience. The term "upper" or "lower" is, for example, a term indicating a relative positional relationship in the drawings. The term "upper" or "lower" does not necessarily define a positional relationship with respect to gravity.

Qualitative analysis and quantitative analysis of a chemical composition of a member included in the semiconductor memory device in the present specification can be performed by, for example, secondary ion mass spectroscopy (SIMS), energy dispersive X-ray spectroscopy (EDX), electron energy loss spectroscopy (EELS), or the like. In addition, for example, a transmission electron microscope (TEM) can be used to measure a thickness of the member included in the semiconductor memory device, a distance between the members, and the like. For example, the TEM, X-ray diffraction (XRD), electron beam diffraction (EBD), X-ray photoelectron spectroscopy (XPS), or a synchrotron radiation X-ray absorption fine structure (XAFS) may be used for identification of a crystal system of a constituent substance of the member included in the semiconductor memory device and comparison of a proportion of the crystal system.

In the present specification, the term "ferroelectric" means a substance having spontaneous polarization without applying an electric field from the outside, and having a polarity which is reversed when an electric field is applied from the outside. In addition, in the present specification, the term "paraelectric substance" means a substance in which polarization occurs when an electric field is applied, and the polarization disappears when the electric field is removed.

First Embodiment

A semiconductor memory device according to a first embodiment includes: a semiconductor layer extending in a first direction; a first gate electrode layer; a first insulating layer provided between the semiconductor layer and the first gate electrode layer; a second insulating layer provided between the first insulating layer and the first gate electrode layer, and the second insulating layer including a first portion containing a ferroelectric material; and a first layer provided between the first insulating layer and the second insulating layer, the first layer containing silicon (Si), nitrogen (N), and fluorine (F), the first layer including a first region and a second region provided between the first region and the second insulating layer, a second atomic ratio (N/Si) of nitrogen (N) to silicon (Si) in the second region being higher than a first atomic ratio (N/Si) of nitrogen (N) to silicon (Si) in the first region, and a first fluorine concentration in the first region being higher than a second fluorine concentration in the second region.

The semiconductor memory device according to the first embodiment includes: a semiconductor layer extending in a first direction; a first gate electrode layer; a first insulating layer provided between the semiconductor layer and the first gate electrode layer; a second insulating layer provided between the first insulating layer and the first gate electrode layer, the second insulating layer containing oxygen (O) and at least one metal element of hafnium (Hf) or zirconium (Zr), the second insulating layer including a first portion, and a main constituent substance of the first portion being a crystal of an orthorhombic crystal system or a crystal of a trigonal crystal system; and a first layer provided between the first insulating layer and the second insulating layer, the first layer containing silicon (Si), nitrogen (N), and fluorine (F), the first layer including a first region and a second region provided between the first region and the second insulating layer, a second atomic ratio (N/Si) of nitrogen (N) to silicon (Si) in the second region higher than a first atomic ratio (N/Si) of nitrogen (N) to silicon (Si) in the first region, and a first fluorine concentration in the first region being higher than a second fluorine concentration in the second region.

The semiconductor memory device according to the first embodiment is a three-dimensional NAND flash memory. A memory cell of the semiconductor memory device according to the first embodiment is a memory cell of a so-called metal-oxide-nitride-oxide-semiconductor type (MONOS type). In addition, the memory cell of the semiconductor memory device according to the first embodiment contains a ferroelectric material in a block insulating layer.

FIG. 1 is a circuit diagram of a memory cell array of the semiconductor memory device according to the first embodiment.

As illustrated in FIG. 1, a memory cell array 100 of the three-dimensional NAND flash memory according to the first embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are disposed apart from each other in a z direction. The plurality of word lines WL are stacked and disposed in the z direction. The plurality of memory strings MS extend in the z direction. The plurality of bit lines BL extend in an x direction, for example.

Hereinafter, the x direction is defined as a second direction, a y direction is defined as a third direction, and the z direction is defined as a first direction. The x direction, the y direction, and the z direction intersect each other, and are, for example, perpendicular to each other.

As illustrated in FIG. 1, the memory string MS includes a source selection transistor SST, a plurality of memory cells, and a drain selection transistor SDT connected in series between the common source line CSL and the bit line BL. One memory string MS is selected by selecting one bit line BL and one drain selection gate line SGD, and one memory cell can be selected by selecting one word line WL. The word line WL functions as a gate electrode of a memory cell transistor MT constituting the memory cell.

Figure 2A:
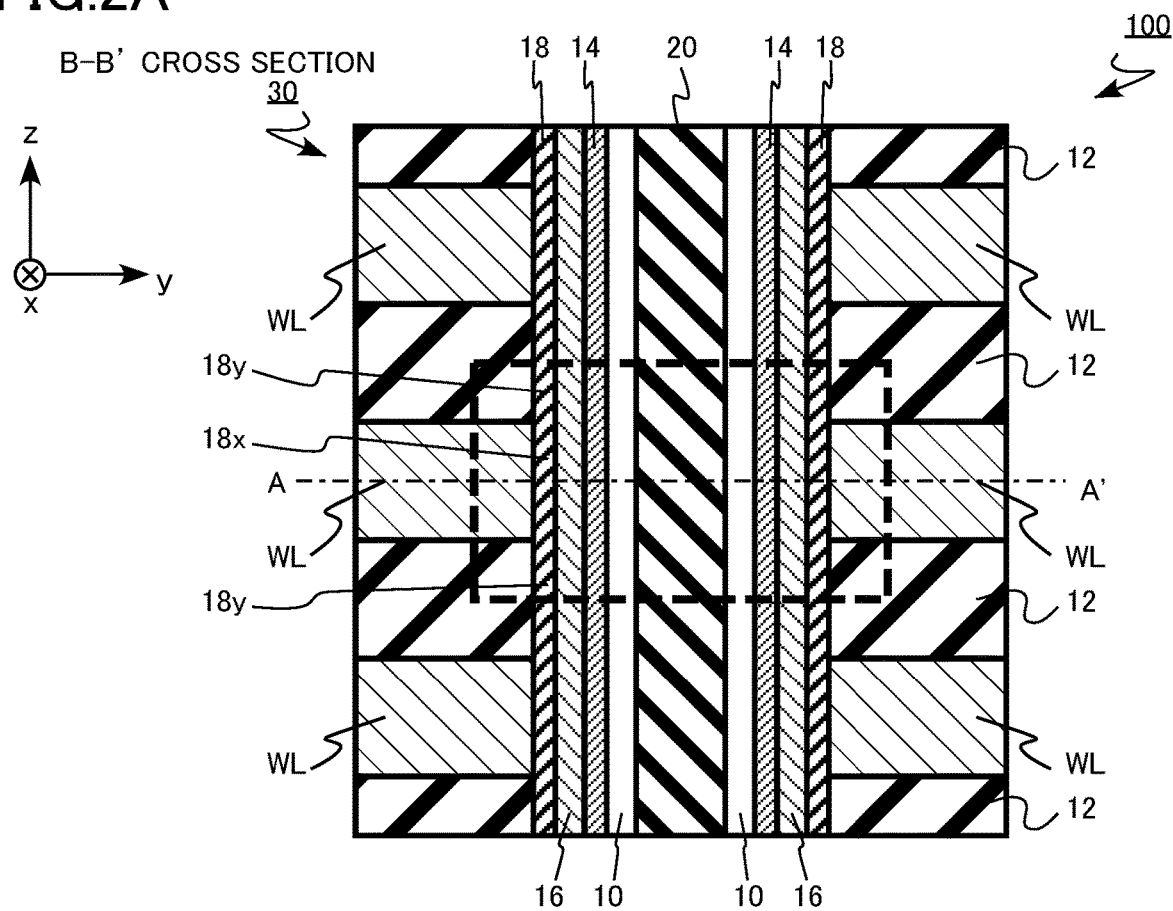
FIGS. 2A and 2B are schematic cross-sectional views of the memory cell array of the semiconductor memory device according to the first embodiment.
Figure 2B:
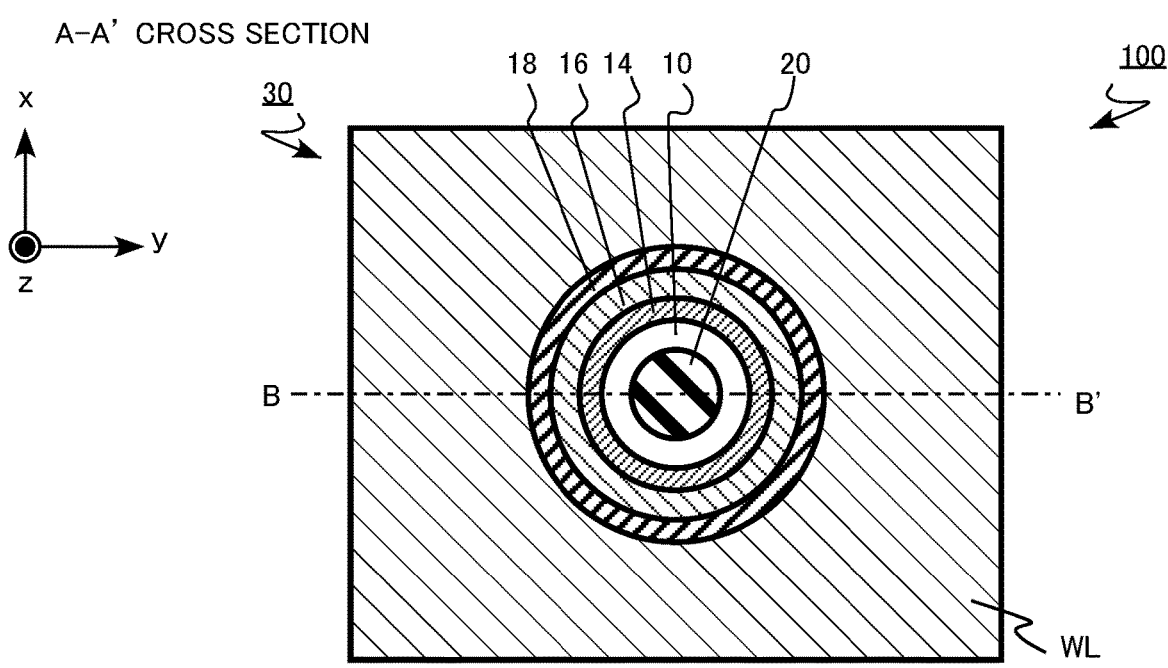

FIGS. 2A and 2B are schematic cross-sectional views of the memory cell array of the semiconductor memory device according to the first embodiment. FIGS. 2A and 2B illustrate cross sections of the plurality of memory cells in one memory string MS surrounded by a dotted line, for example, in the memory cell array 100 of FIG. 1.

FIG. 2A is a yz cross-sectional view of the memory cell array 100. FIG. 2A illustrates a cross section taken along B-B' of FIG. 2B. FIG. 2B is an xy cross-sectional view of the memory cell array 100. FIG. 2B illustrates a cross section taken along A-A' of FIG. 2A. In FIG. 2A, a region surrounded by a broken line is one memory cell.

Figure 3:
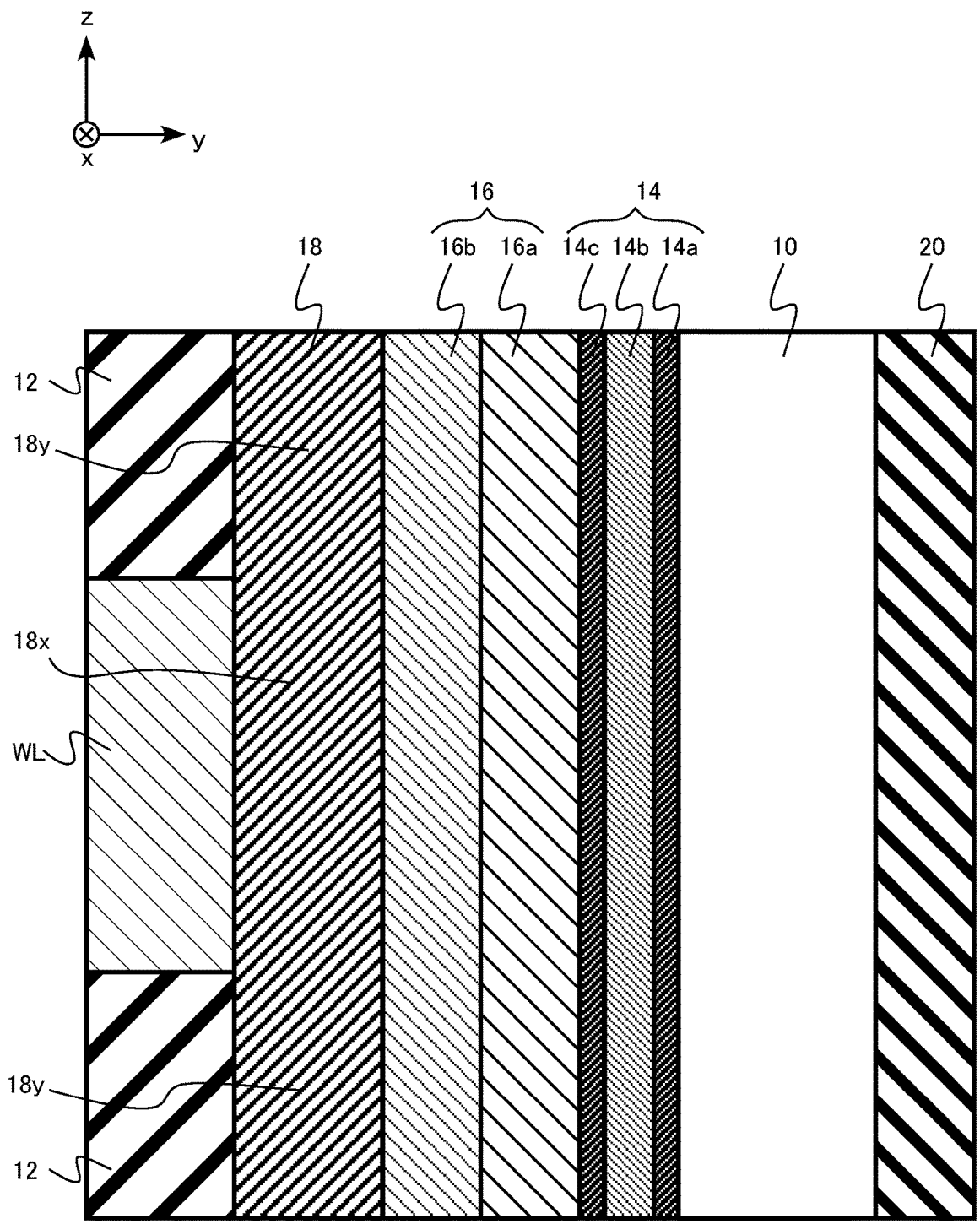
FIG. 3 is a schematic cross-sectional view of a memory cell of the semiconductor memory device according to the first embodiment.

FIG. 3 is a schematic cross-sectional view of the memory cell of the semiconductor memory device according to the first embodiment. FIG. 3 is an enlarged cross-sectional view of a part of the memory cell.

As illustrated in FIGS. 2A, 2B, and 3, the memory cell array 100 includes the plurality of word lines WL, a semiconductor layer 10, a plurality of interlayer insulating layers 12, a tunnel insulating layer 14, a charge storage layer 16, a block insulating layer 18, and a core insulating region 20. The plurality of word lines WL and the plurality of interlayer insulating layers 12 constitute a stacked body 30. The tunnel insulating layer 14 has a lower layer portion 14a, an intermediate portion 14b, and an upper layer portion 14c. The charge storage layer 16 has a buffer region 16a and a charge storage region 16b. The block insulating layer 18 has a first portion 18x and a second portion 18y.

One of the plurality of word lines WL is an example of the first gate electrode layer. Another one of the plurality of word lines WL is an example of a second gate electrode layer. The second gate electrode layer is provided apart from the first gate electrode layer in the z direction.

The interlayer insulating layer 12 is an example of a third insulating layer. The tunnel insulating layer 14 is an example of the first insulating layer. The block insulating layer 18 is an example of the second insulating layer. The charge storage layer 16 is an example of the first layer. The buffer region 16a is an example of the first region. The charge storage region 16b is an example of the second region.

The memory cell array 100 is provided, for example, on a semiconductor substrate (not illustrated). The semiconductor substrate has a surface parallel to the x direction and the y direction.

The word lines WL and the interlayer insulating layers 12 are alternately stacked in the z direction on the semiconductor substrate. The word lines WL are repeatedly disposed apart from each other in the z direction. The plurality of word lines WL and the plurality of interlayer insulating layers 12 constitute a stacked body 30. The word line WL functions as a control electrode of the memory cell transistor MT.

The word line WL is a plate-shaped conductor. The word line WL is, for example, a metal, a metal nitride, a metal carbide, or a semiconductor. The word line WL is tungsten (W), for example. A thickness of the word line WL in the z direction is, for example, equal to or more than 5 nm and equal to or less than 20 nm.

The interlayer insulating layer 12 isolates the word lines WL from each other. The interlayer insulating layer 12 electrically isolates the word lines WL from each other.

The interlayer insulating layer 12 is, for example, an oxide, an oxynitride, or a nitride. The interlayer insulating layer 12 is, for example, silicon oxide. A thickness of the interlayer insulating layer 12 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided in such a manner as to penetrate through the stacked body 30. The semiconductor layer 10 is surrounded by the plurality of word lines WL. The semiconductor layer 10 has, for example, a cylindrical shape. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the word line WL. The tunnel insulating layer 14 is provided between the semiconductor layer 10 and at least one of the plurality of word lines WL. The tunnel insulating layer 14 is provided between the semiconductor layer 10 and the charge storage layer 16. The tunnel insulating layer 14 has a function of passing charges according to a voltage applied between the word line WL and the semiconductor layer 10.

The tunnel insulating layer 14 contains, for example, silicon (Si), nitrogen (N), and oxygen (O). The tunnel insulating layer 14 contains, for example, silicon nitride or silicon oxynitride. A thickness of the tunnel insulating layer 14 is, for example, equal to or more than 3 nm and equal to or less than 8 nm.

The tunnel insulating layer 14 has the lower layer portion 14a, the intermediate portion 14b, and the upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The lower layer portion 14a is, for example, silicon oxide. The intermediate portion 14b is, for example, silicon nitride or silicon oxynitride. The upper layer portion 14c is, for example, silicon oxide.

The charge storage layer 16 is provided between the tunnel insulating layer 14 and the block insulating layer 18.

The charge storage layer 16 has a function of trapping and accumulating charges. The charge is, for example, an electron. A threshold voltage of the memory cell transistor MT changes according to the amount of charge accumulated in the charge storage layer 16. By using this change in threshold voltage, one memory cell can store data.

For example, as the threshold voltage of the memory cell transistor MT changes, a voltage at which the memory cell transistor MT is turned on changes. For example, in a case where a state in which the threshold voltage is high is defined as data "0" and a state in which the threshold voltage is low is defined as data "1", the memory cell can store 1-bit data of "0" and "1".

The charge storage layer 16 contains silicon (Si), nitrogen (N), and fluorine (F). The charge storage layer 16 contains, for example, silicon nitride. A thickness of the charge storage layer 16 is, for example, equal to or more than 3 nm and equal to or less than 10 nm.

The charge storage layer 16 has a buffer region 16a and a charge storage region 16b. The charge storage region 16b is provided between the buffer region 16a and the block insulating layer 18. The charge storage region 16b is in contact with the block insulating layer 18.

The buffer region 16a contains silicon (Si), nitrogen (N), and fluorine (F). The charge storage region 16b contains silicon (Si) and nitrogen (N). The charge storage region 16b contains or does not contain fluorine (F). A fluorine concentration of the buffer region 16a is higher than a fluorine concentration of the charge storage region 16b.

A second atomic ratio (N/Si) of nitrogen (N) to silicon (Si) in the charge storage region 16b is higher than a first atomic ratio (N/Si) of nitrogen (N) to silicon (Si) in the buffer region 16a.

The first atomic ratio (N/Si) is, for example, equal to or less than 1.25. The second atomic ratio (N/Si) is, for example, more than 1.25.

Note that in a case where silicon nitride has a stoichiometric composition (stoichiometry), that is, in a case where silicon nitride has a composition of $Si_3N_4$, the atomic ratio (N/Si) of nitrogen (N) to silicon (Si) is 1.33.

A first fluorine concentration of the buffer region 16a is, for example, equal to or more than $2\times10^{20}$ atoms/cm$^3$. A second fluorine concentration of the charge storage region 16b is, for example, equal to or less than $1\times10^{20}$ atoms/cm$^{-3}$.

The block insulating layer 18 is provided between the tunnel insulating layer 14 and the word line WL. The block insulating layer 18 is provided between the charge storage layer 16 and the word line WL. The block insulating layer 18 has a function of blocking a current flowing between the charge storage layer 16 and the word line WL. A thickness of the block insulating layer 18 is, for example, equal to or more than 3 nm and equal to or less than 10 nm.

The block insulating layer 18 has a first portion 18x and a second portion 18y. The first portion 18x is a portion disposed between the word line WL and the semiconductor layer 10. The second portion 18y is a portion disposed between the interlayer insulating layer 12 and the semiconductor layer 10. The second portions 18y are disposed in the z direction with respect to the first portion 18x. The first portion 18x is interposed between the second portions 18y.

The block insulating layer 18 contains a ferroelectric material. The block insulating layer 18 is a ferroelectric layer. The block insulating layer 18 has ferroelectricity.

The first portion 18x contains the ferroelectric material. The first portion 18x has ferroelectricity. The second portion 18y contains the ferroelectric material. The second portion 18y has ferroelectricity.

The block insulating layer 18 contains, for example, oxygen (O), and at least one metal element of hafnium (Hf) or zirconium (Zr). Hereinafter, for convenience of explanation, at least one metal element of hafnium (Hf) or zirconium (Zr) contained in the block insulating layer 18 may be referred to as a main constituent metal element.

The first portion 18x of the block insulating layer 18 contains, for example, oxygen (O), and at least one metal element of hafnium (Hf) or zirconium (Zr). The first portion 18x of the block insulating layer 18 is formed of, for example, a crystal of the orthorhombic crystal system or the trigonal crystal system as a main constituent substance.

The second portion 18y of the block insulating layer 18 contains, for example, oxygen (O), and at least one metal element of hafnium (Hf) or zirconium (Zr). The second portion 18y of the block insulating layer 18 is formed of, for example, a crystal of the orthorhombic crystal system or the trigonal crystal system as a main constituent substance.

Among atomic concentrations of elements other than oxygen (O) contained in the block insulating layer 18, an atomic concentration of the main constituent metal element is the highest. A proportion of the atomic concentration of the main constituent metal element in a total of the atomic concentrations of the elements other than oxygen (O) contained in the block insulating layer 18 is, for example, equal to or more than 90%.

The block insulating layer 18 contains, for example, at least one of hafnium oxide or zirconium oxide.

The block insulating layer 18 contains, for example, hafnium oxide as a main component. Containing hafnium oxide as a main component means that a molar ratio of hafnium oxide is the highest among the substances contained in the block insulating layer 18. The molar ratio of hafnium oxide contained in the block insulating layer 18 is, for example, equal to or more than 90%.

The block insulating layer 18 contains, for example, zirconium oxide as a main component. Containing zirconium oxide as a main component means that a molar ratio of zirconium oxide is the highest among the substances contained in the block insulating layer 18.

The molar ratio of zirconium oxide contained in the block insulating layer 18 is, for example, equal to or more than 40% and equal to or less than 60%. The oxide contained in the block insulating layer 18 is, for example, a mixed crystal of hafnium oxide and zirconium oxide.

Hafnium oxide has ferroelectricity in a case where hafnium oxide is a crystal of the orthorhombic crystal system or the trigonal crystal system. Hafnium oxide is a ferroelectric in a case where hafnium oxide is a crystal of the orthorhombic crystal system or the trigonal crystal system.

Hafnium oxide has ferroelectricity, for example, in a case where hafnium oxide is a crystal of a third orthorhombic crystal system (orthorhombic III, space group Pbc2$_1$, and space group number 29) or a crystal of the trigonal crystal system (trigonal, space group R3m, P3, or R3, and space group number 160, 143, or 146).

Hafnium oxide does not have ferroelectricity in a case where hafnium oxide is a crystal other than a crystal of the orthorhombic crystal system or the trigonal crystal system, or in a case where hafnium oxide is amorphous. Hafnium oxide is a paraelectric substance in a case where hafnium oxide is a crystal other than a crystal of the orthorhombic crystal system or the trigonal crystal system, or in a case where hafnium oxide is amorphous. A crystal system other than the orthorhombic crystal system or the trigonal crystal system is a cubic crystal system, a hexagonal crystal system, a tetragonal crystal system, a monoclinic crystal system, or a triclinic crystal system.

Zirconium oxide has ferroelectricity in a case where zirconium oxide is a crystal of the orthorhombic crystal system or the trigonal crystal system. Zirconium oxide is a ferroelectric in a case where zirconium oxide is a crystal of the orthorhombic crystal system or the trigonal crystal system.

Zirconium oxide has ferroelectricity, for example, in a case where zirconium oxide is a crystal of the third orthorhombic crystal system (orthorhombic III, space group Pbc2$_1$, and space group number 29) or a crystal of the trigonal crystal system (trigonal, space group R3m, P3, or R3, and space group number 160, 143, or 146).

Zirconium oxide does not have ferroelectricity in a case where zirconium oxide is a crystal other than a crystal of the orthorhombic crystal system or the trigonal crystal system, or in a case where zirconium oxide is amorphous. Zirconium oxide is a paraelectric substance in a case where zirconium oxide is a crystal other than a crystal of the orthorhombic crystal system or the trigonal crystal system, or in a case where zirconium oxide is amorphous.

The block insulating layer 18 contains, for example, at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The oxide contained in the block insulating layer 18 contains the additive element described above. In a case where the oxide is hafnium oxide, as the additive element is contained, hafnium oxide easily exhibits ferroelectricity.

The core insulating region 20 is provided in the stacked body 30. The core insulating region 20 extends in the z direction. The core insulating region 20 is provided in such a manner as to penetrate through the stacked body 30. The core insulating region 20 is surrounded by the semiconductor layer 10. The core insulating region 20 is surrounded by the plurality of word lines WL. The core insulating region 20 has a columnar shape. The core insulating region 20 has, for example, a cylindrical shape.

The core insulating region 20 is, for example, an oxide, an oxynitride, or a nitride. The core insulating region 20 contains, for example, silicon (Si) and oxygen (O). The core insulating region 20 is, for example, silicon oxide.

Figure 4:
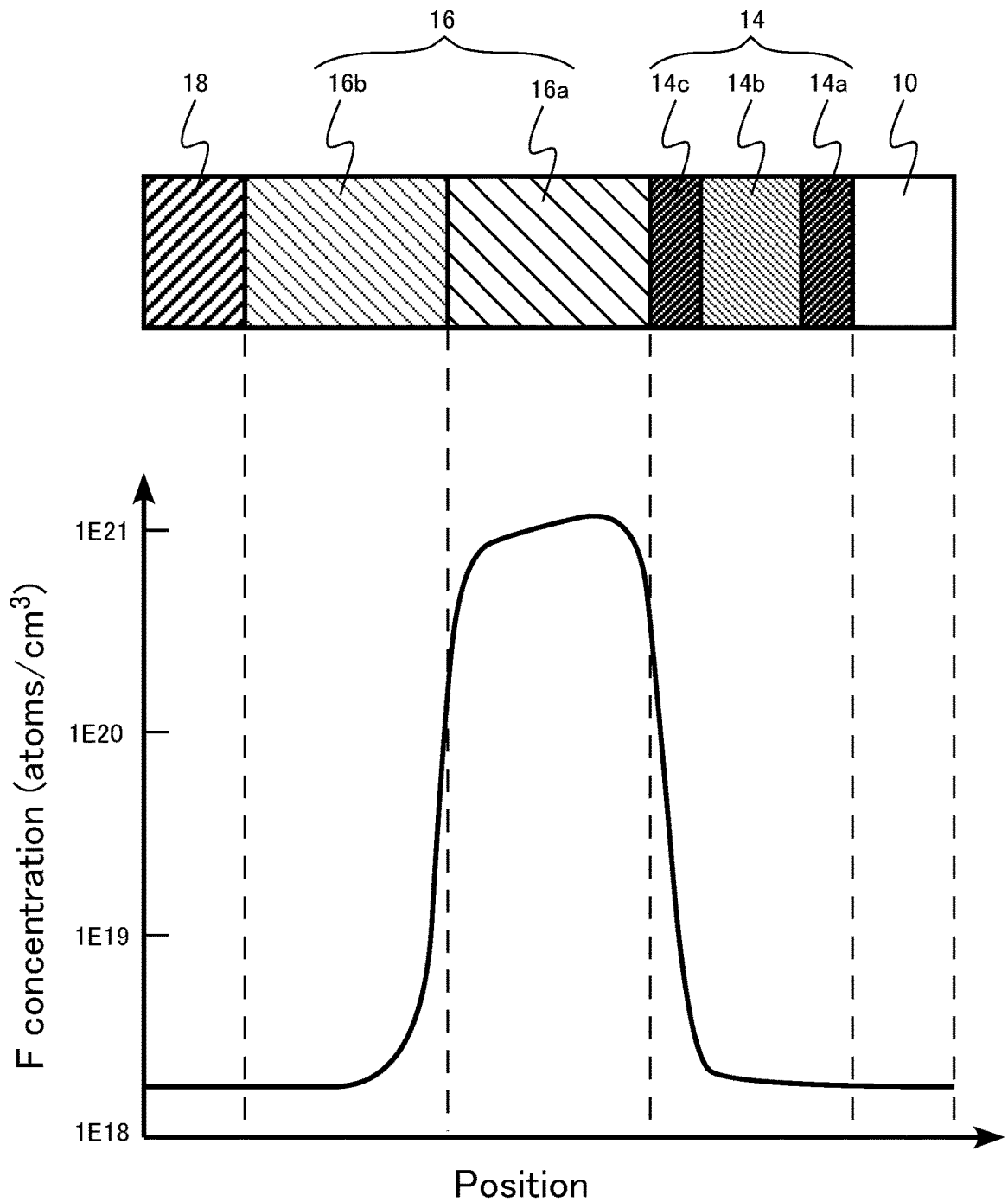
FIG. 4 is a diagram illustrating distribution of fluorine concentrations of the semiconductor memory device according to the first embodiment.

FIG. 4 is a diagram illustrating distribution of the fluorine concentrations of the semiconductor memory device according to the first embodiment. FIG. 4 illustrates an example of distribution of the fluorine concentrations of the semiconductor layer 10, the tunnel insulating layer 14, the charge storage layer 16, and the block insulating layer 18.

A fluorine concentration of the buffer region 16a is higher than a fluorine concentration of the charge storage region 16b. The fluorine concentration of the buffer region 16a is higher than the fluorine concentration of the tunnel insulating layer 14. The fluorine concentration of the buffer region 16a is higher than the fluorine concentration of the block insulating layer 18. The fluorine concentration of the buffer region 16a is higher than the fluorine concentration of the semiconductor layer 10.

The fluorine concentration of the tunnel insulating layer 14 is, for example, equal to or less than $1 \times 10^{20}$ atoms/cm$^3$. The fluorine concentration of the block insulating layer 18 is, for example, equal to or less than $1 \times 10^{20}$ atoms/cm$^3$. The fluorine concentration of the semiconductor layer 10 is, for example, equal to or less than $1 \times 10^{20}$ atoms/cm$^3$.

Next, an example of a method for manufacturing the semiconductor memory device according to the first embodiment will be described.

FIGS. 5, 6, 7, 8, 9, 10, 11, 12, 13, and 14 are schematic cross-sectional views illustrating the method for manufacturing the semiconductor memory device according to the first embodiment. FIGS. 5 to 14 each illustrate a cross section corresponding to FIG. 2A. FIGS. 5 to 14 are views illustrating an example of the method of manufacturing the memory cell array 100 of the semiconductor memory device.

Figure 5:
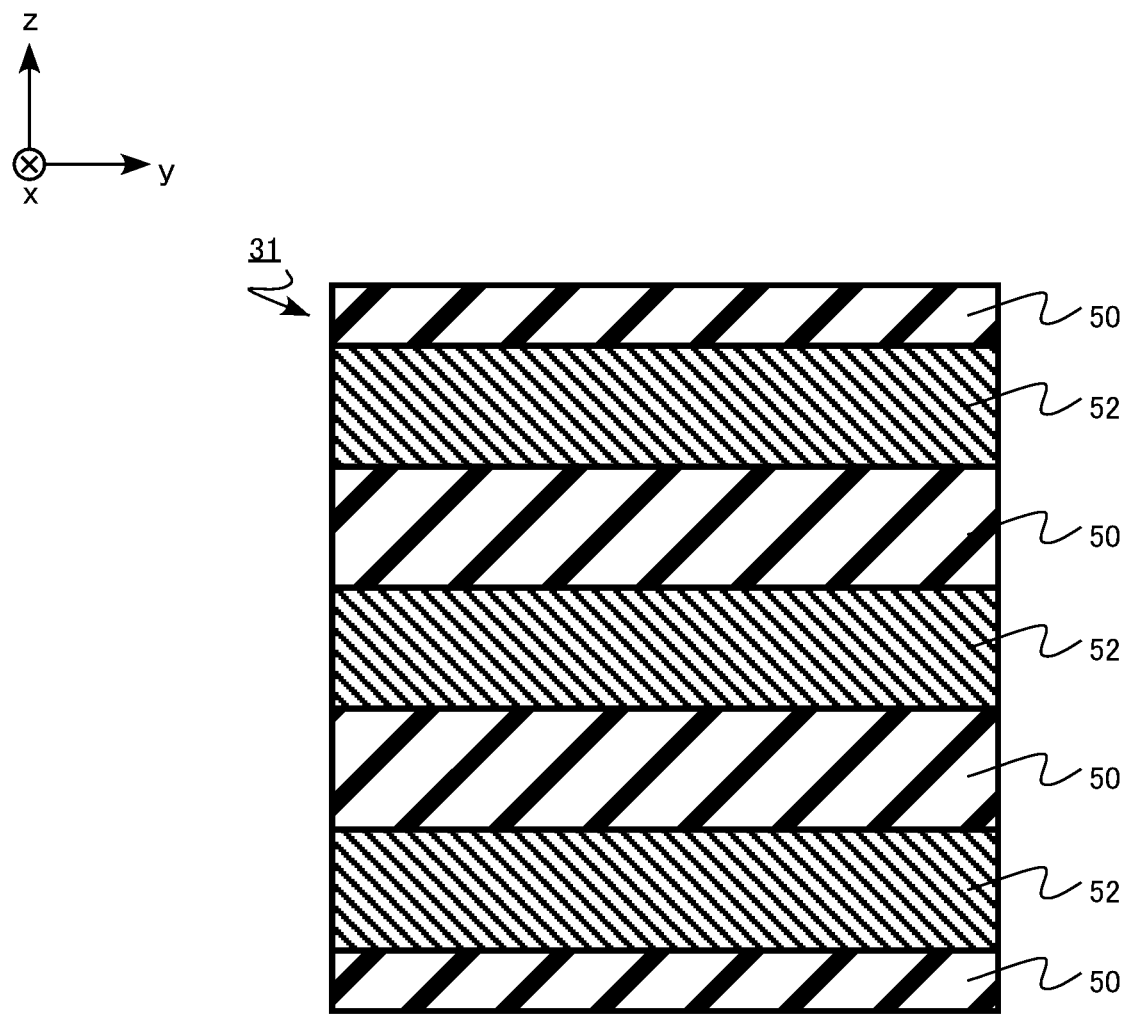
FIG. 5 is a schematic cross-sectional view illustrating a method for manufacturing the semiconductor memory device according to the first embodiment.

First, silicon oxide layers 50 and silicon nitride layers 52 are alternately stacked on the semiconductor substrate (not illustrated) (FIG. 5). A stacked structure 31 in which the plurality of silicon oxide layers 50 and the plurality of silicon nitride layers 52 are alternately stacked in the z direction is formed. A part of the stacked structure 31 finally becomes the stacked body 30.

The silicon oxide layer 50 and the silicon nitride layer 52 are formed by, for example, a chemical vapor deposition method (CVD method). A part of the silicon oxide layer 50 finally becomes the interlayer insulating layer 12.

Figure 6:
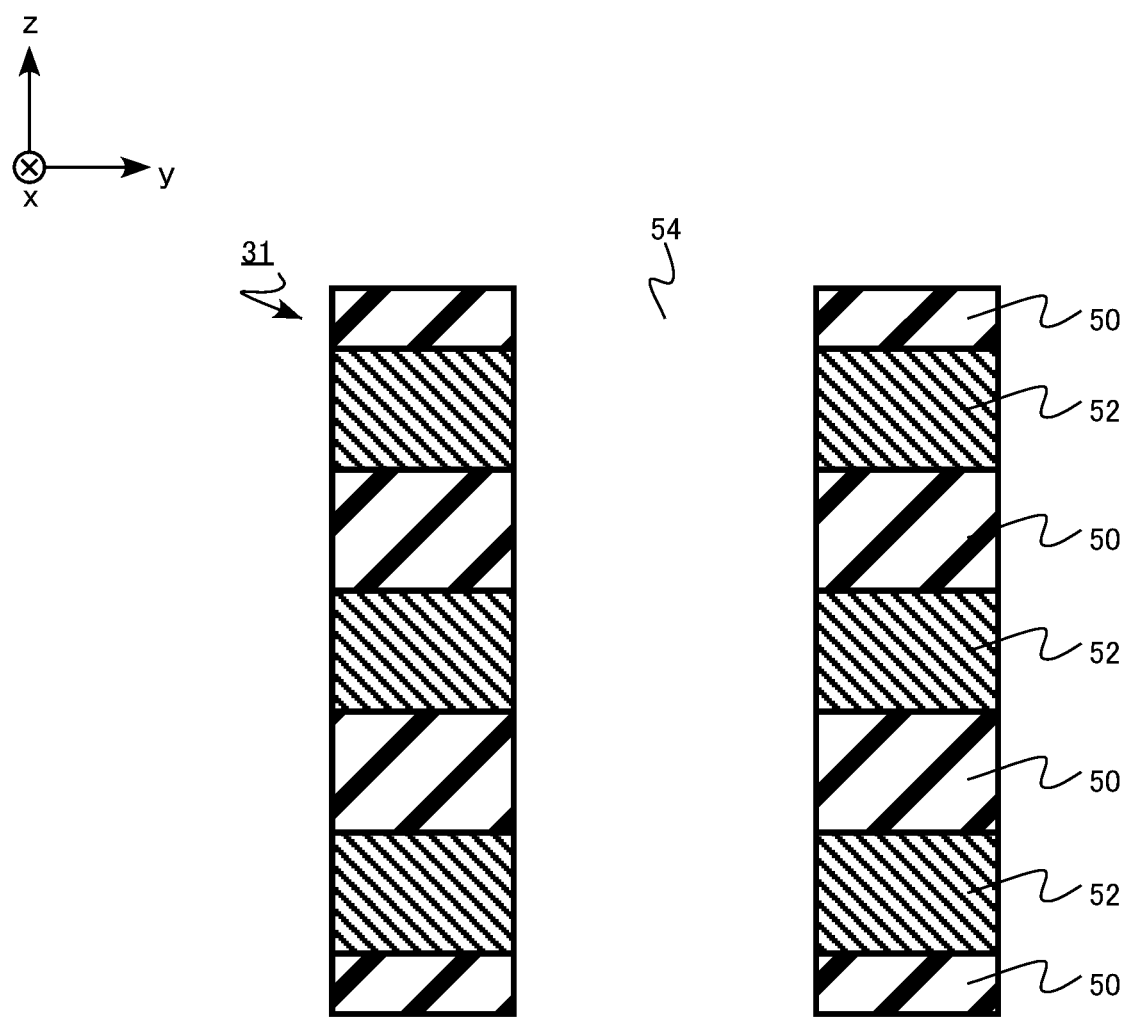
FIG. 6 is a schematic cross-sectional view illustrating the method for manufacturing the semiconductor memory device according to the first embodiment.

Next, a memory hole 54 is formed in the silicon oxide layer 50 and the silicon nitride layer 52 (FIG. 6). The memory hole 54 penetrates through the stacked structure 31 and extends in the z direction. The memory hole 54 is formed by, for example, a lithography method and a reactive ion etching method (RIE method).

Figure 7:
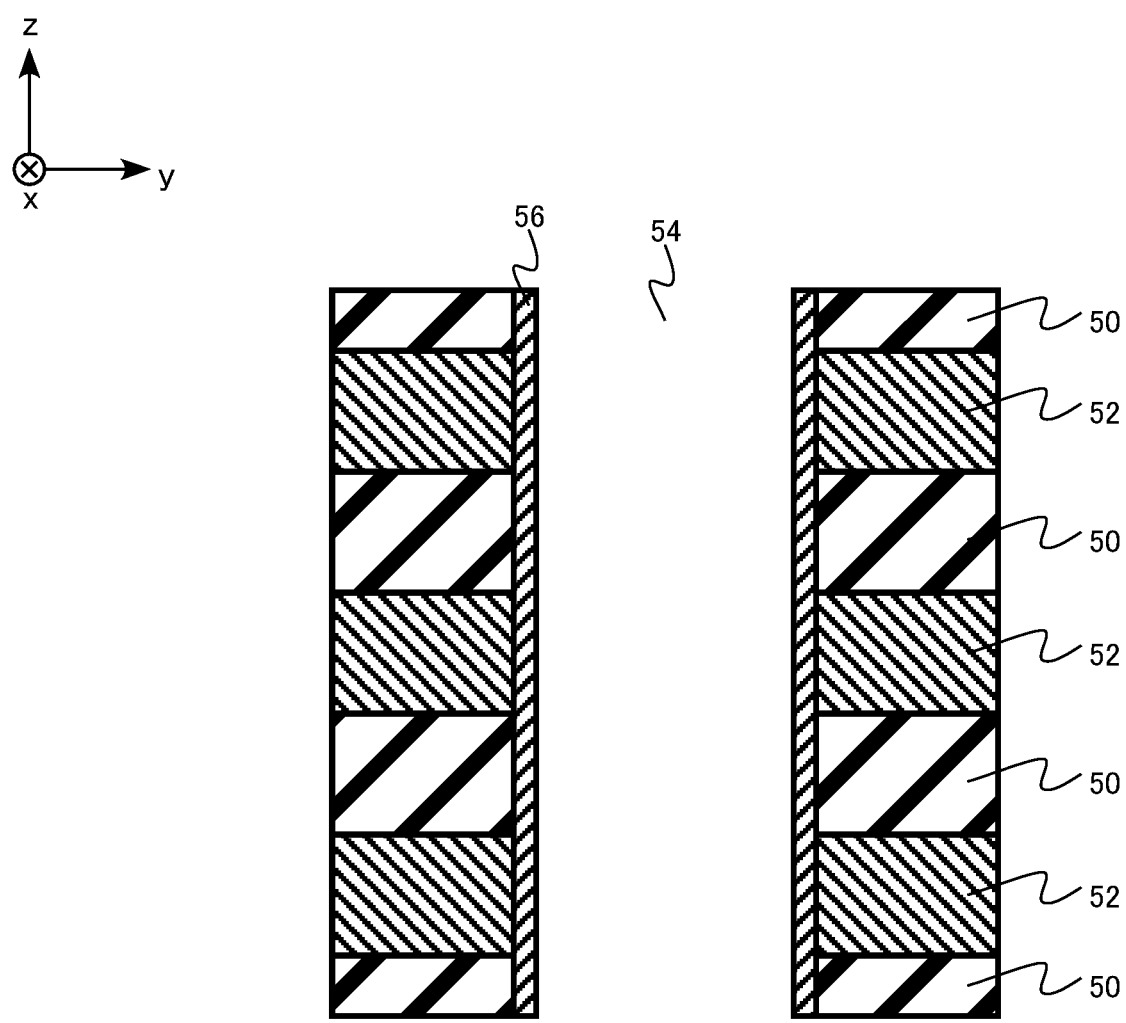
FIG. 7 is a schematic cross-sectional view illustrating the method for manufacturing the semiconductor memory device according to the first embodiment.

Next, a hafnium oxide film 56 is formed on an inner wall of the memory hole 54 (FIG. 7). The hafnium oxide film 56 is formed by, for example, an atomic layer deposition method (ALD method). For example, silicon (Si) is added to the hafnium oxide film 56 as the additive element. The hafnium oxide film 56 finally becomes the block insulating layer 18.

Figure 8:
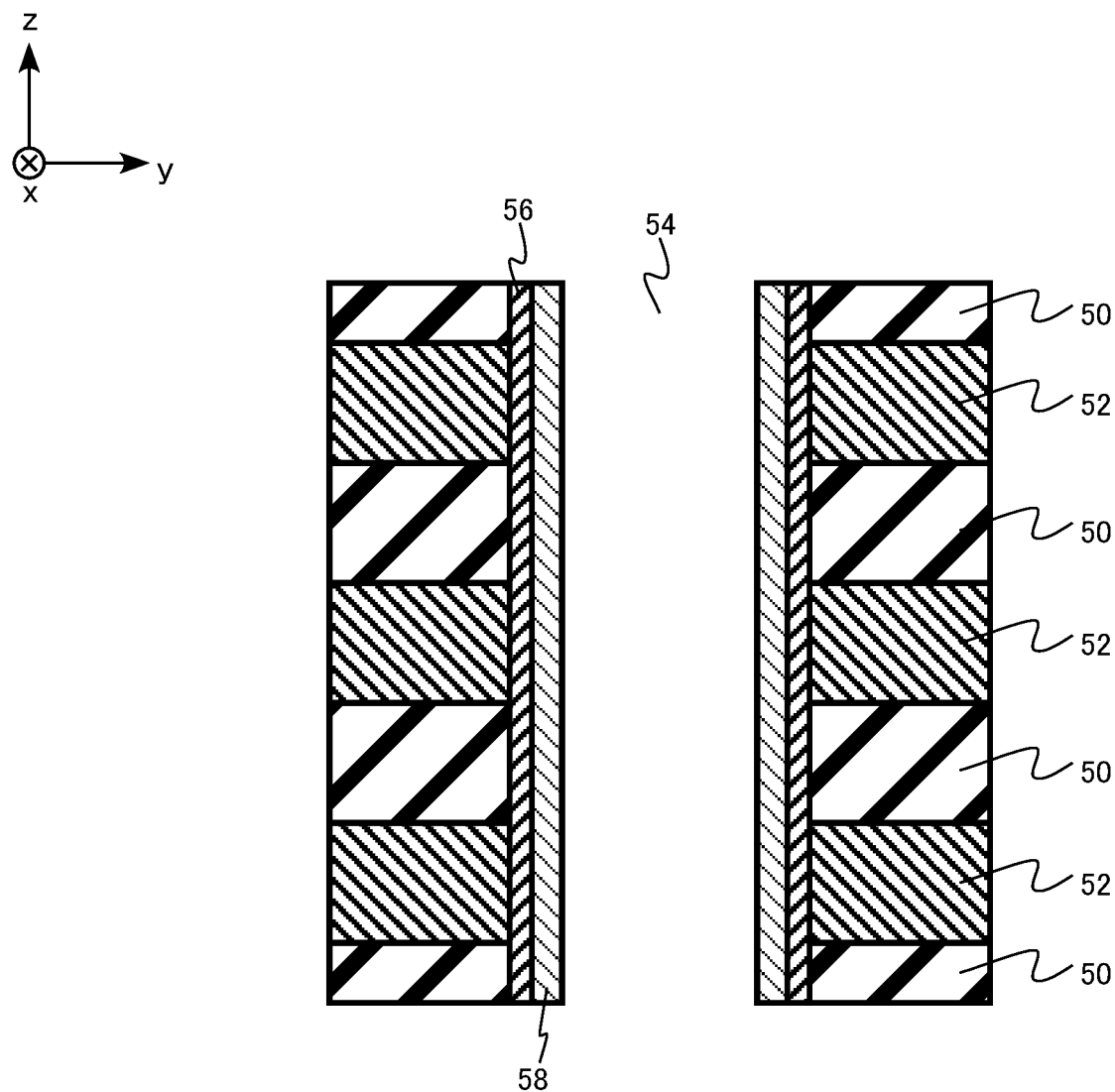
FIG. 8 is a schematic cross-sectional view illustrating the method for manufacturing the semiconductor memory device according to the first embodiment.

Next, a silicon nitride film 58 is formed on the hafnium oxide film 56 (FIG. 8). The silicon nitride film 58 is formed by, for example, the ALD method. The silicon nitride film 58 finally becomes the charge storage layer 16.

When the silicon nitride film 58 is formed, for example, a first silicon nitride film and a second silicon nitride film are continuously deposited. An atomic ratio (N/Si) of nitrogen (N) to silicon (Si) in the first silicon nitride film is higher than an atomic ratio (N/Si) of nitrogen (N) to silicon (Si) in the second silicon nitride film.

The first silicon nitride film finally becomes the charge storage region 16b. The second silicon nitride film finally becomes the buffer region 16a.

Figure 9:
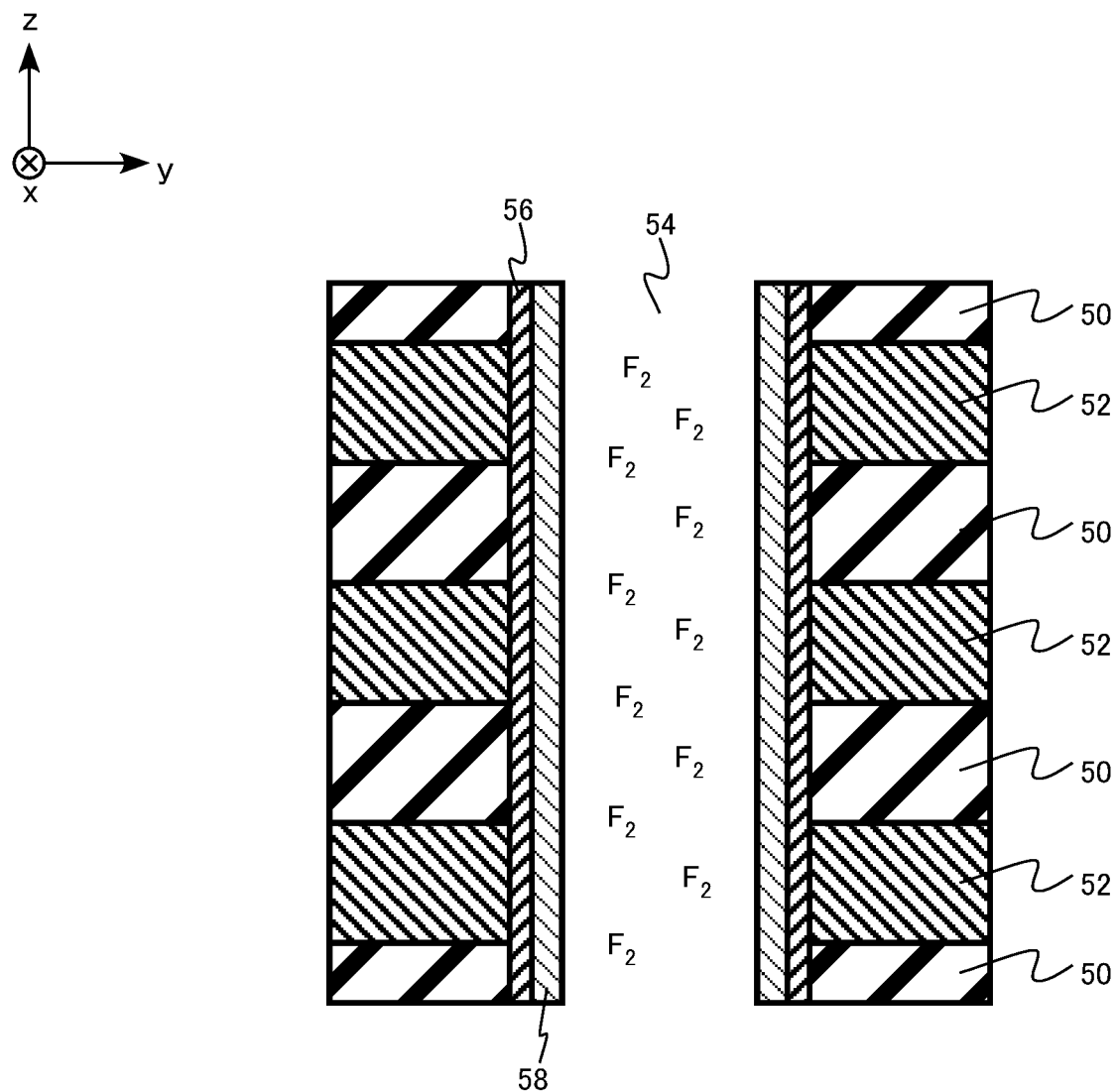
FIG. 9 is a schematic cross-sectional view illustrating the method for manufacturing the semiconductor memory device according to the first embodiment.

Next, heat treatment is performed in an atmosphere containing fluorine (F) (FIG. 9). The heat treatment in the atmosphere containing fluorine (F) is, for example, a heat treatment in an atmosphere containing fluorine gas ($F_2$) or nitrogen trifluoride gas ($NF_3$). By this heat treatment, fluorine is introduced into the silicon nitride film 58.

Figure 10:
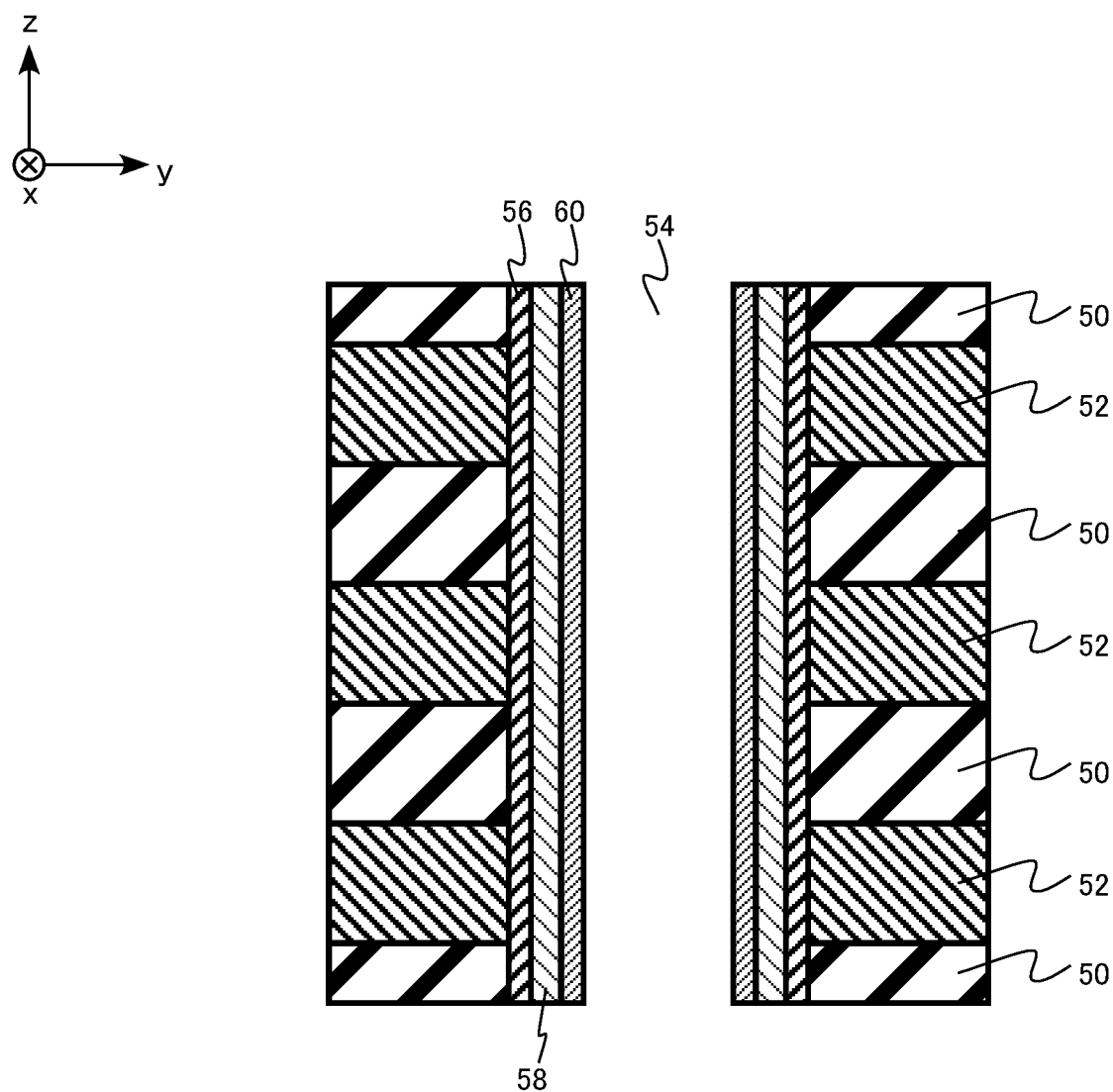
FIG. 10 is a schematic cross-sectional view illustrating the method for manufacturing the semiconductor memory device according to the first embodiment.

Next, a stacked insulating film 60 is formed on the silicon nitride film 58 (FIG. 10). The stacked insulating film 60 is, for example, a stacked film of a silicon oxide film, a silicon nitride film, and a silicon oxide film.

The stacked insulating film 60 is formed by, for example, the CVD method. The stacked insulating film 60 finally becomes the tunnel insulating layer 14.

Figure 11:
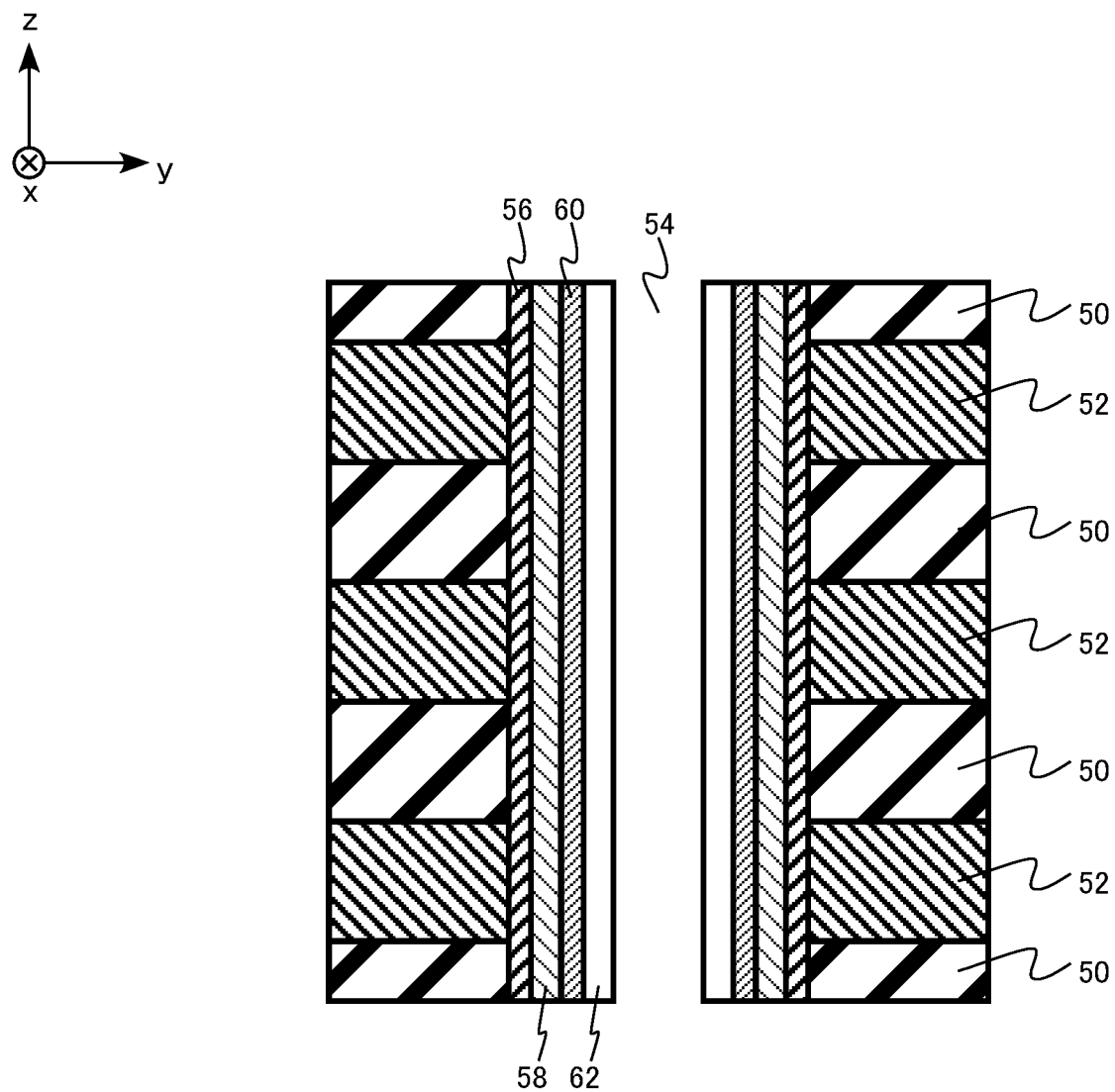
FIG. 11 is a schematic cross-sectional view illustrating the method for manufacturing the semiconductor memory device according to the first embodiment.

Next, a polycrystalline silicon film 62 is formed on the stacked insulating film 60 (FIG. 11). The polycrystalline silicon film 62 is formed by, for example, the CVD method. The polycrystalline silicon film 62 finally becomes the semiconductor layer 10.

Figure 12:
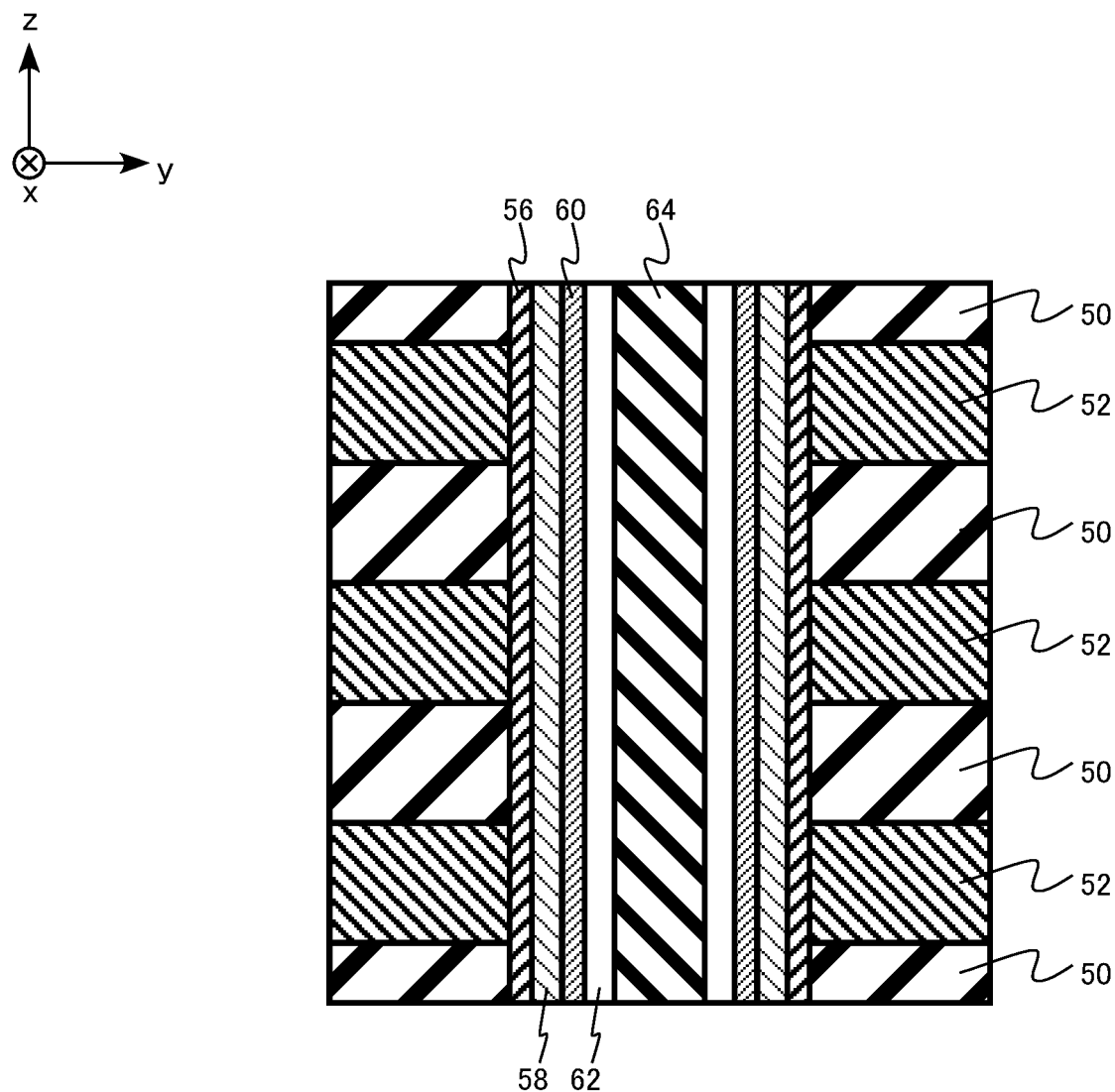
FIG. 12 is a schematic cross-sectional view illustrating the method for manufacturing the semiconductor memory device according to the first embodiment.

Next, the memory hole 54 is filled with a silicon oxide film 64 (FIG. 12). The silicon oxide film 64 is formed on the polycrystalline silicon film 62. The silicon oxide film 64 is formed by, for example, the CVD method. The silicon oxide film 64 finally becomes the core insulating region 20.

Figure 13:
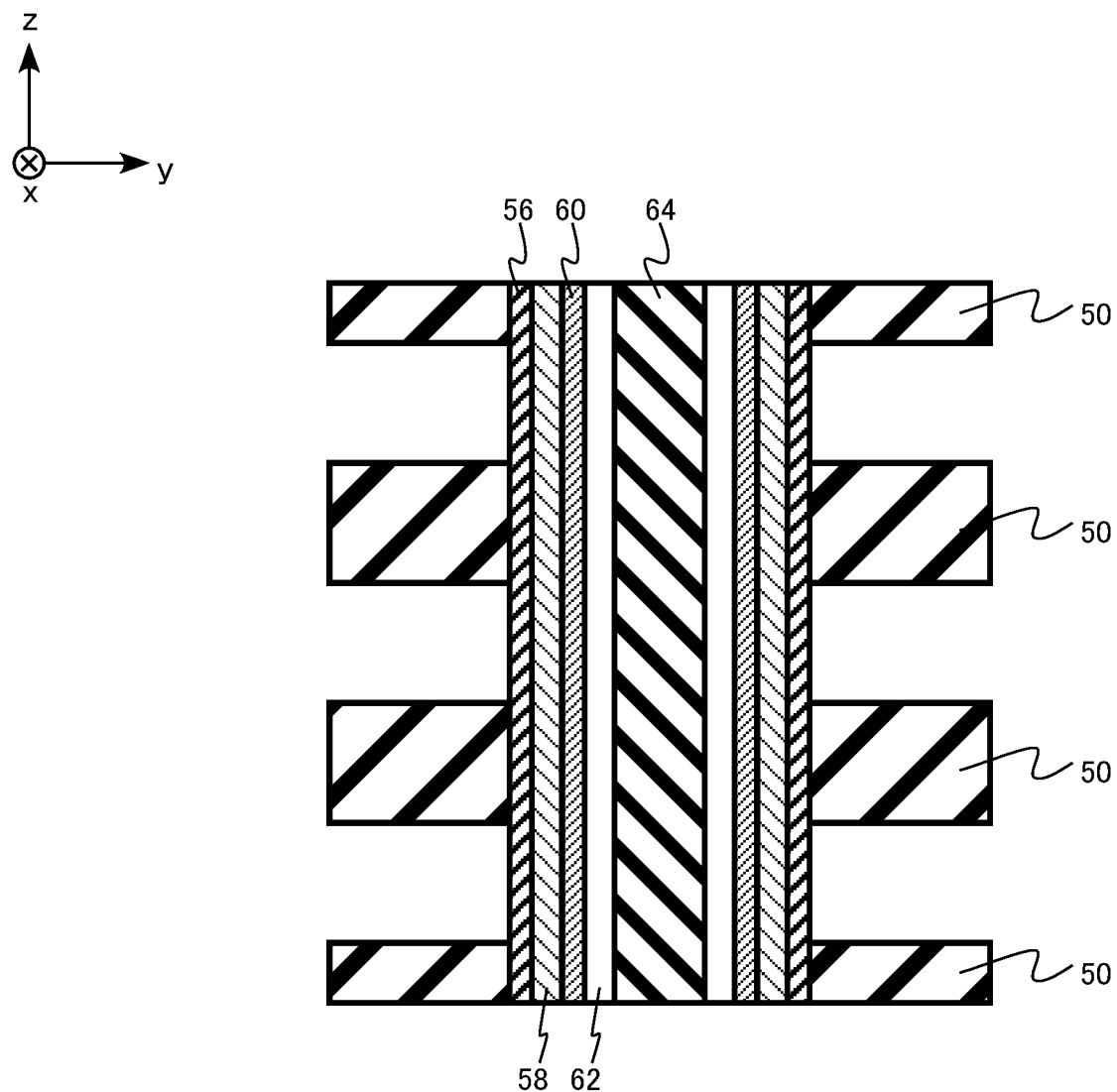
FIG. 13 is a schematic cross-sectional view illustrating the method for manufacturing the semiconductor memory device according to the first embodiment.

Next, the silicon nitride layer 52 is selectively removed by wet etching using an etching groove (not illustrated) (FIG. 13). For the wet etching, for example, a phosphoric acid solution is used. The silicon nitride layer 52 is selectively etched with respect to the silicon oxide layer 50 and the hafnium oxide film 56.

Figure 14:
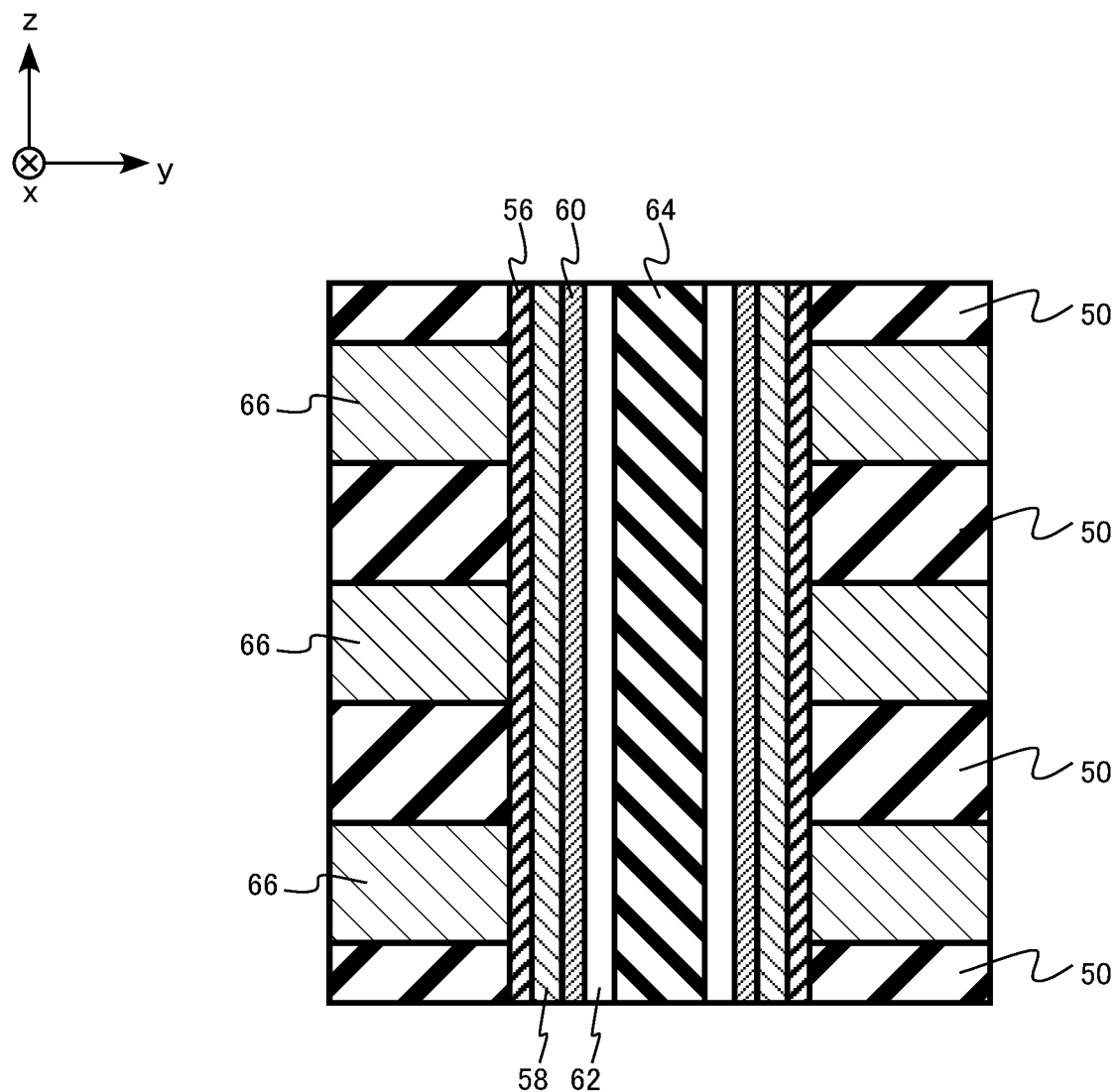
FIG. 14 is a schematic cross-sectional view illustrating the method for manufacturing the semiconductor memory device according to the first embodiment.

Next, a tungsten film 66 is formed in a region from which the silicon nitride layer 52 has been removed (FIG. 14). The tungsten film 66 is formed by, for example, the CVD method.

The tungsten film 66 finally becomes the word line WL. Before the tungsten film 66 is formed, for example, a barrier metal film such as a titanium nitride film can be formed.

After the tungsten film 66 is formed, crystallization annealing is performed. The hafnium oxide film 56 becomes a ferroelectric by the crystallization annealing.

The memory cell array 100 of the semiconductor memory device according to the first embodiment is manufactured by the above manufacturing method.

Next, functions and effects of the semiconductor memory device according to the first embodiment will be described.

In the three-dimensional NAND flash memory according to the first embodiment, a ferroelectric is used for the block insulating layer 18. By using a ferroelectric for the block insulating layer 18, for example, a characteristic of writing data in the memory cell and a characteristic of erasing data from the memory cell are improved.

Figure 15:
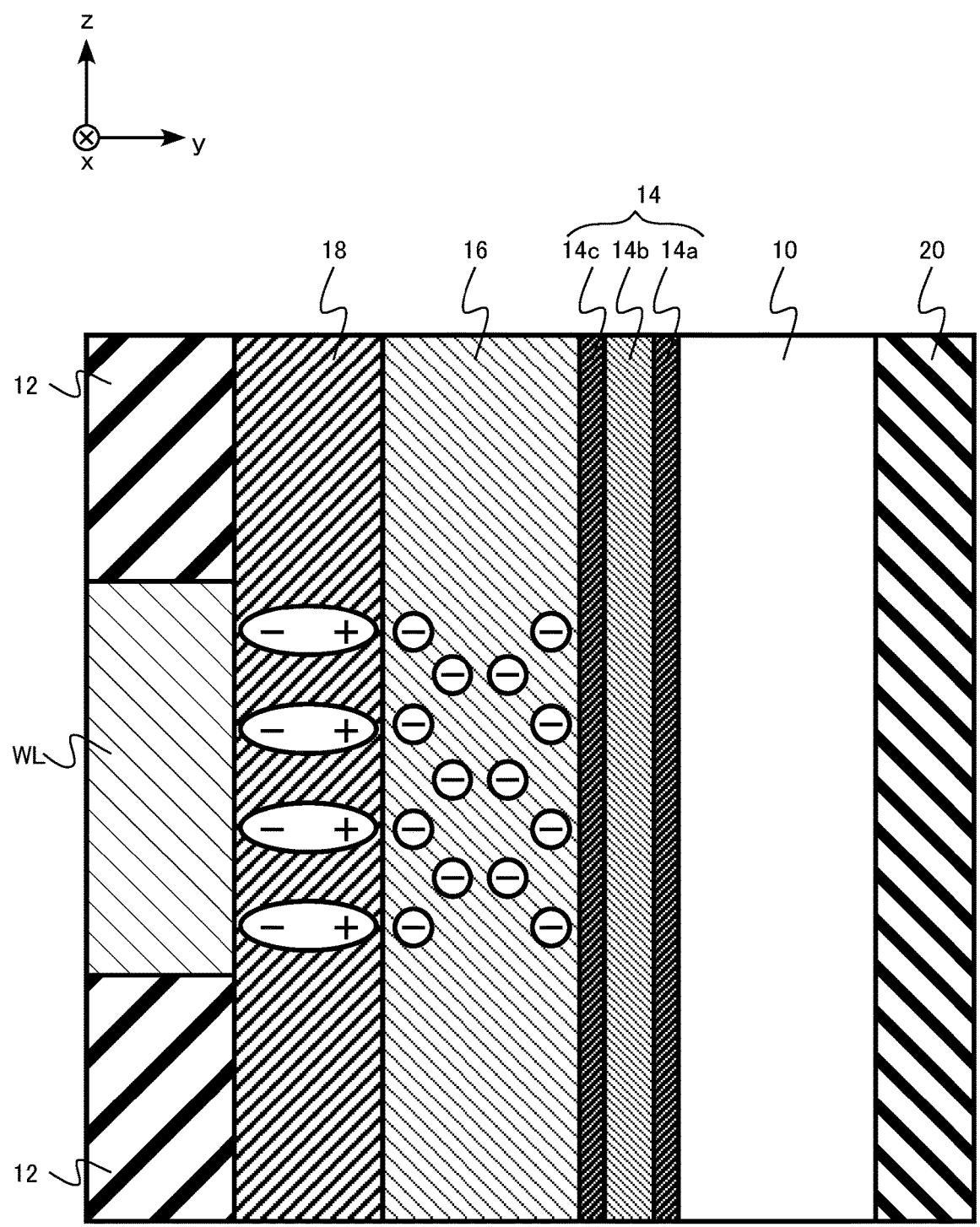
FIG. 15 is a diagram for describing functions and effects of the semiconductor memory device according to the first embodiment.

FIG. 15 is a diagram for describing functions and effects of the semiconductor memory device according to the first embodiment. FIG. 15 is a schematic cross-sectional view of a memory cell of a semiconductor memory device according to a comparative example. FIG. 15 is a diagram corresponding to FIG. 3 of the semiconductor memory device according to the first embodiment. The semiconductor memory device according to the comparative example is different from the semiconductor memory device according to the first embodiment illustrated in FIG. 3 in that the charge storage layer 16 does not have the buffer region 16a having a high fluorine concentration.

FIG. 15 illustrates a state when data is written in the memory cell. As a positive voltage is applied to the word line WL, electrons are injected from the semiconductor layer 10 into the charge storage layer 16.

As a positive voltage is applied to the word line WL, the ferroelectric block insulating layer 18 is polarized as illustrated in FIG. 15. The block insulating layer 18 is polarized in such a manner that the word line WL side is negative and the charge storage layer 16 side is positive.

Since the block insulating layer 18 is polarized in such a manner that the charge storage layer 16 side is positive, a force acts on the electrons in a direction of being attracted to the block insulating layer 18. Therefore, injection of electrons from the semiconductor layer 10 into the charge storage layer 16 is promoted. Therefore, for example, a speed of writing of electrons in the charge storage layer 16 is increased, and the characteristic of writing data in the memory cell is improved.

In a case where data is erased from the memory cell, a negative voltage is applied to the word line WL. As a negative voltage is applied to the word line WL, holes are injected from the semiconductor layer 10 into the charge storage layer 16, and the data of the memory cell is erased.

By applying a negative voltage to the word line WL, the block insulating layer 18 is polarized in a direction opposite to the case of FIG. 15, that is, the block insulating layer 18 is polarized in such a manner that the word line WL side is positive and the charge storage layer 16 side is negative.

Since the block insulating layer 18 is polarized in such a manner that the charge storage layer 16 side is negative, a force acts on the holes in a direction of being attracted to the block insulating layer 18. Therefore, injection of holes from the semiconductor layer 10 into the charge storage layer 16 is promoted. Therefore, for example, a speed of injection of holes into the charge storage layer 16 is increased, and the characteristic of erasing data from the memory cell is improved.

Figure 16:
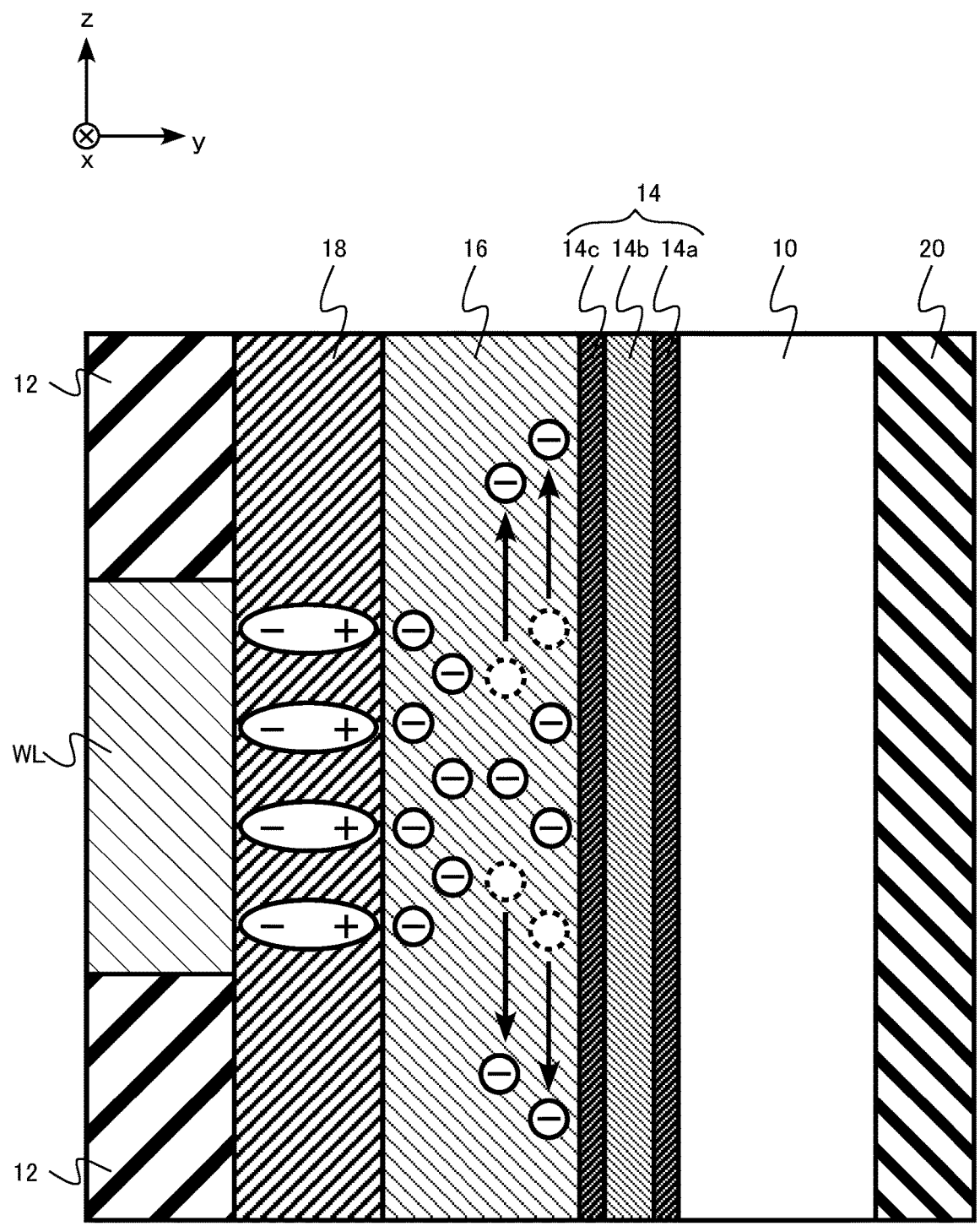
FIG. 16 is a diagram for describing functions and effects of the semiconductor memory device according to the first embodiment.

FIG. 16 is a diagram for describing functions and effects of the semiconductor memory device according to the first embodiment. FIG. 16 is a schematic cross-sectional view of the memory cell of the semiconductor memory device according to the comparative example. FIG. 16 is a diagram corresponding to FIG. 15.

FIG. 16 illustrates a state in which data is retained in the memory cell. For example, 0 V is applied to the word line WL. At the time of writing data, electrons written in the charge storage layer 16 are trapped in a trap level of the charge storage layer 16, and data of the memory cell is retained.

The polarization of the block insulating layer 18 is maintained as it is at the time of writing data. That is, the block insulating layer 18 is polarized in such a manner that the word line WL side is negative and the charge storage layer 16 side is positive.

A force attracting electrons to the block insulating layer 18 depends on a distance from the charge storage layer 16 to the trapped electrons. Therefore, the electrons trapped at a position far from the charge storage layer 16 are less attracted to the block insulating layer 18, and as illustrated in FIG. 16, the electrons are easily detrapped. So-called lateral migration of electrons occurs. Once the lateral migration of electrons occurs, a data amount of the memory cell varies. Therefore, a charge retention characteristic of the memory cell is degraded.

The charge storage layer 16 of the semiconductor memory device according to the first embodiment has the buffer region 16a having a high fluorine concentration. Since the charge storage layer 16 has the buffer region 16a having a high fluorine concentration, the charge retention characteristic of the memory cell is improved.

Figure 17:
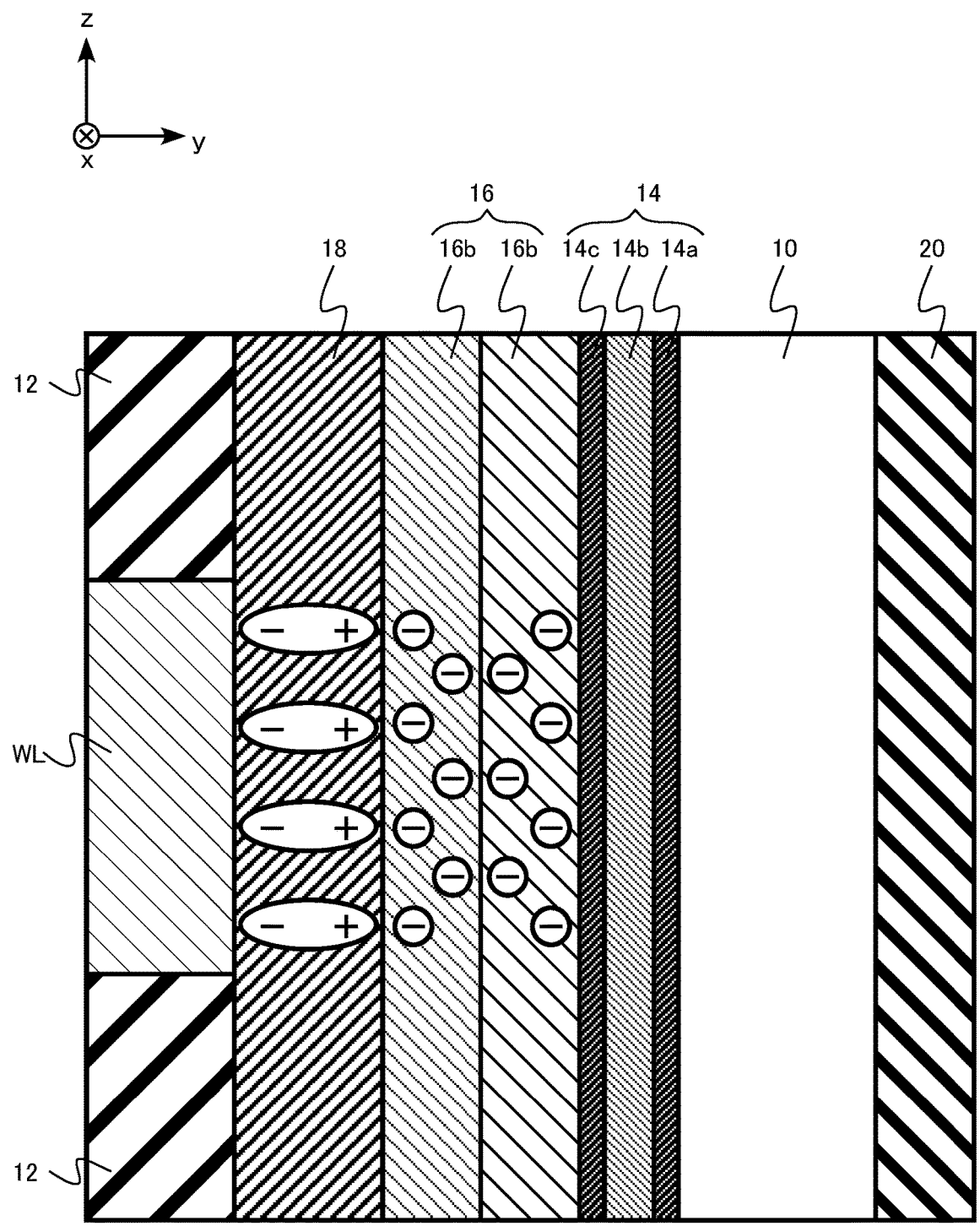
FIG. 17 is a diagram for describing functions and effects of the semiconductor memory device according to the first embodiment.

FIG. 17 is a diagram for describing functions and effects of the semiconductor memory device according to the first embodiment. FIG. 17 is a schematic cross-sectional view of the memory cell of the semiconductor memory device according to the first embodiment. FIG. 17 is a diagram corresponding to FIG. 3 of the semiconductor memory device according to the first embodiment. FIG. 17 is a diagram corresponding to FIG. 15 of the semiconductor memory device according to the comparative example.

FIG. 17 illustrates a state when data is written in the memory cell. As a positive voltage is applied to the word line WL, electrons are injected from the semiconductor layer 10 into the charge storage layer 16. Similarly to the comparative example, the block insulating layer 18 is polarized in such a manner that the word line WL side is negative and the charge storage layer 16 side is positive. Therefore, similarly to the comparative example, the speed of writing of electrons in the charge storage layer 16 is increased, and the characteristic of writing data in the memory cell is improved. In addition, similarly to the comparative example, the characteristic of erasing data from the memory cell is improved.

Figure 18:
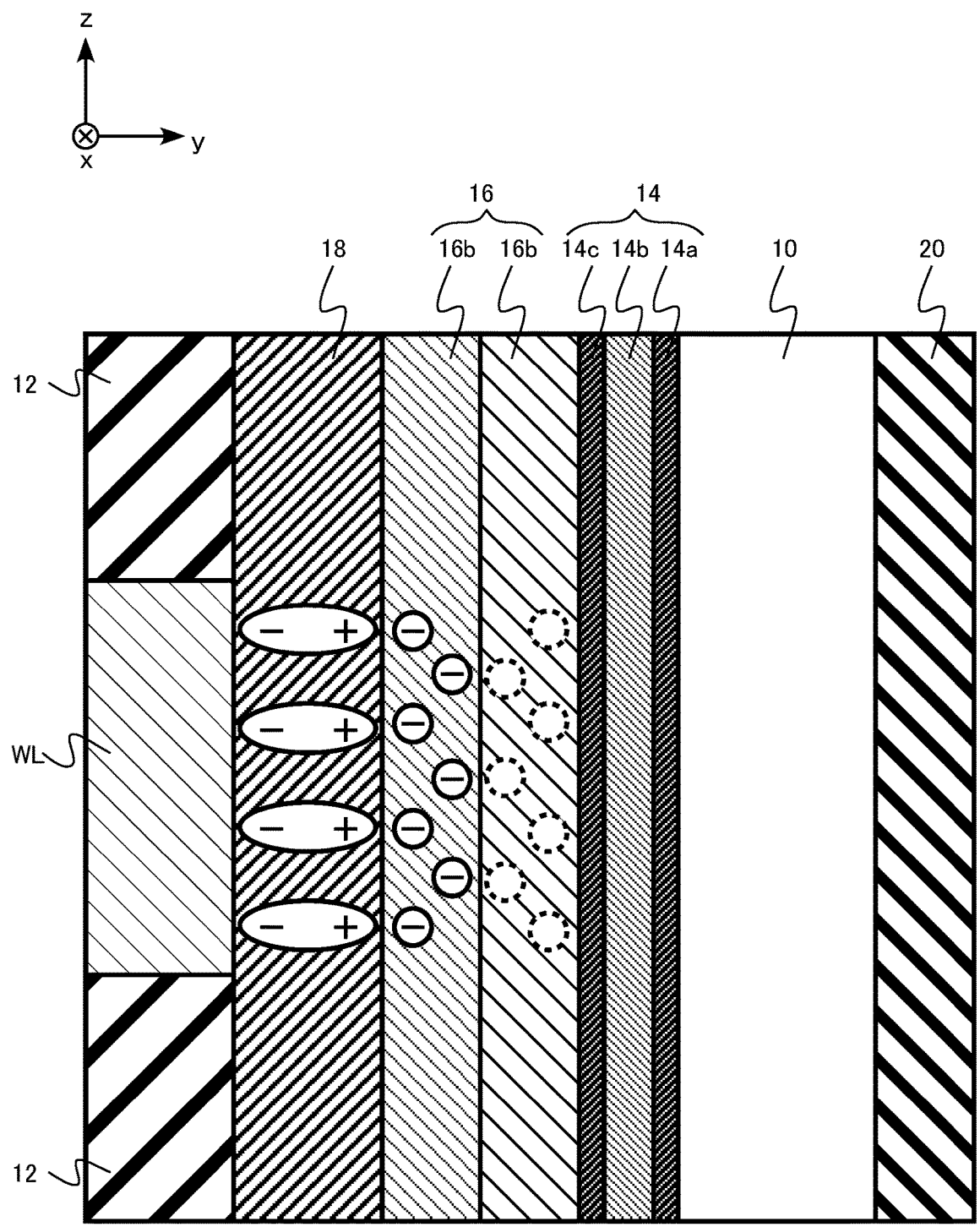
FIG. 18 is a diagram for describing functions and effects of the semiconductor memory device according to the first embodiment.

FIG. 18 is a diagram for describing functions and effects of the semiconductor memory device according to the first embodiment. FIG. 18 is a schematic cross-sectional view of the memory cell of the semiconductor memory device according to the first embodiment. FIG. 18 is a diagram corresponding to FIG. 16 of the semiconductor memory device according to the comparative example.

FIG. 18 illustrates a state in which data is retained in the memory cell. For example, 0 V is applied to the word line WL. At the time of writing data, electrons written in the charge storage layer 16 are trapped in a trap level of the charge storage layer 16, and data of the memory cell is retained.

The polarization of the block insulating layer 18 is maintained as it is at the time of writing data. That is, the block insulating layer 18 is polarized in such a manner that the word line WL side is negative and the charge storage layer 16 side is positive.

For example, the trap level of the buffer region 16a is extremely shallower than a trap level of the charge storage region 16b due to the high fluorine concentration. Therefore, electrons trapped in the trap level of the buffer region 16a at the time of writing data are trapped in an extremely short time. Specifically, after data is written in the memory cell, electrons are trapped until verification reading.

Therefore, electrons trapped at the trap level of the buffer region 16a at the time of writing data do not contribute to the data amount of the memory cell. Therefore, for example, the variation in data amount of the memory cell is suppressed as compared with the comparative example. Therefore, the charge retention characteristic of the memory cell is improved.

Figure 19:
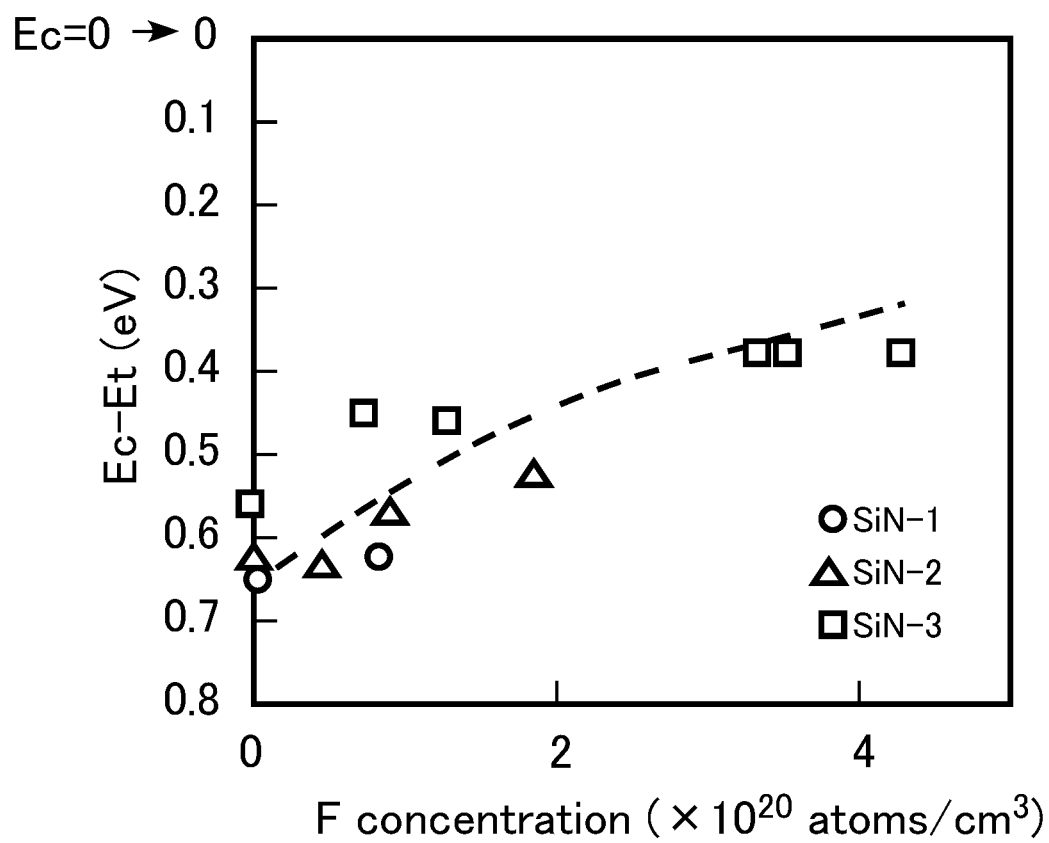
FIG. 19 is a diagram for describing functions and effects of the semiconductor memory device according to the first embodiment.

FIG. 19 is a diagram for describing functions and effects of the semiconductor memory device according to the first embodiment. FIG. 19 is a diagram illustrating a relationship between the fluorine concentration of the silicon nitride film and a depth of the trap level in a band gap of the silicon nitride film.

In FIG. 19, a horizontal axis represents the fluorine concentration, and a vertical axis represents the depth of the trap level from a lower end of a conduction band. Samples having different atomic ratios (N/Si) of nitrogen (N) to silicon (Si) in the silicon nitride film are evaluated. The atomic ratio (N/Si) decreases in the order of SiN-1, SiN-2, and SiN-3. For example, SiN-3 has a smaller proportion of nitrogen (N) and a larger proportion of silicon (Si) than SiN-1.

As is apparent from FIG. 19, it is appreciated that as the fluorine concentration of the silicon nitride film increases, the trap level with a shallow depth of about 0.6 eV decreases to a depth of about 0.4 eV. The change in depth of the trap level does not depend on the atomic ratio (N/Si) in the silicon nitride film.

Therefore, in the memory cell according to the first embodiment, since the buffer region 16a contains fluorine, the trap level changes to an extremely shallow trap level. Therefore, the charge retention characteristic of the memory cell is improved.

Note that when the trap level contributing to retention of charges present in the charge storage region 16b becomes shallow, the charge retention characteristic may be degraded. In the memory cell according to the first embodiment, the fluorine concentration of the buffer region 16a is higher than the fluorine concentration of the charge storage region 16b. In other words, the fluorine concentration of the charge storage region 16b is lower than the fluorine concentration of the buffer region 16a.

In the memory cell according to the first embodiment, by lowering the fluorine concentration of the charge storage region 16b, it is possible to suppress the trap level contributing to retention of charges present in the charge storage region 16b from becoming shallow.

Figure 20:
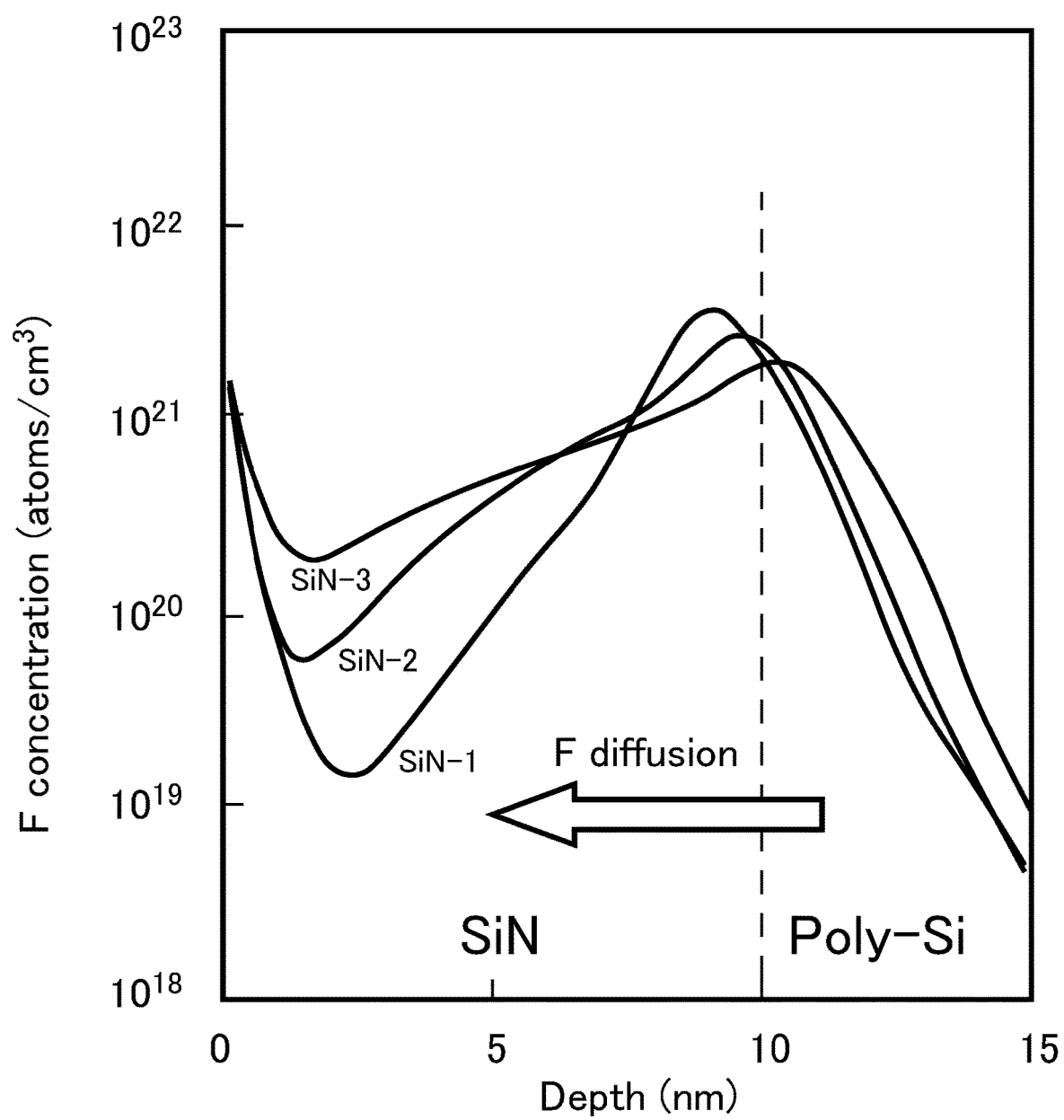
FIG. 20 is a diagram for describing functions and effects of the semiconductor memory device according to the first embodiment.

FIG. 20 is a diagram for describing functions and effects of the semiconductor memory device according to the first embodiment. FIG. 20 illustrates distribution of the fluorine concentration in a case where fluorine is thermally diffused from a polycrystalline silicon film (Poly-Si) containing fluorine to a silicon nitride film in contact with the polycrystalline silicon film.

In FIG. 20, a horizontal axis represents a depth based on an interface between the silicon nitride film and the substrate, and a vertical axis represents the fluorine concentration. Samples having different atomic ratios (N/Si) of nitrogen (N) to silicon (Si) in the silicon nitride film are evaluated. The atomic ratio (N/Si) decreases in the order of SiN-1, SiN-2, and SiN-3. For example, SiN-3 has a smaller proportion of nitrogen (N) and a larger proportion of silicon (Si) than SiN-1.

As is apparent from FIG. 20, it is appreciated that the larger the proportion of silicon (Si) in the silicon nitride film is, the faster the diffusion of fluorine in the silicon nitride film is.

In the semiconductor memory device according to the first embodiment, the atomic ratio (N/Si) in the buffer region 16a is made lower than the atomic ratio (N/Si) in the charge storage region 16b. When the semiconductor memory device according to the first embodiment is manufactured, the proportion of silicon (Si) in the second silicon nitride film as the buffer region 16a is made larger than the proportion of silicon (Si) in the first silicon nitride film as the charge storage region 16b. Then, after the charge storage layer 16 is formed, fluorine is diffused to the tunnel insulating layer 14 from a side opposite from the block insulating layer 18.

Therefore, in the buffer region 16a in which the proportion of silicon (Si) is large and diffusion of fluorine is fast, the fluorine concentration is high as illustrated in FIG. 4. On the other hand, in the charge storage region 16b in which the proportion of silicon (Si) is small and diffusion of fluorine is slow, the fluorine concentration is kept low as illustrated in FIG. 4.

In the semiconductor memory device according to the first embodiment, a structure in which the fluorine concentration of the buffer region 16a is high and the fluorine concentration of the charge storage region 16b is low can be easily implemented by increasing the proportion of silicon (Si) in the buffer region 16a.

From the viewpoint of decreasing the depth of the trap level of the buffer region 16a, the first fluorine concentration of the buffer region 16a is preferably equal to or more than $2 \times 10^{20}$ atoms/cm$^3$, and more preferably, equal to or more than $5 \times 10^{20}$ atoms/cm$^3$.

From the viewpoint of suppressing the trap level of the charge storage region 16b from becoming shallow, the second fluorine concentration of the charge storage region 16b is preferably equal to or less than $1 \times 10^{20}$ atoms/cm$^3$, more preferably, equal to or less than $5 \times 10^{19}$ atoms/cm$^3$, and still more preferably, equal to or less than $1 \times 10^{19}$ atoms/cm$^3$.

From the viewpoint of promoting diffusion of fluorine in the buffer region 16a, the first atomic ratio (N/Si) of nitrogen (N) to silicon (Si) in the buffer region 16a is preferably equal to or less than 1.25, and more preferably, equal to or less than 1.10.

From the viewpoint of suppressing diffusion of fluorine to the charge storage region 16b, the atomic ratio (N/Si) of nitrogen (N) to silicon (Si) in the charge storage region 16b is preferably higher than 1.25, more preferably higher than 1.30, and still more preferably higher than 1.33.

Figure 21:
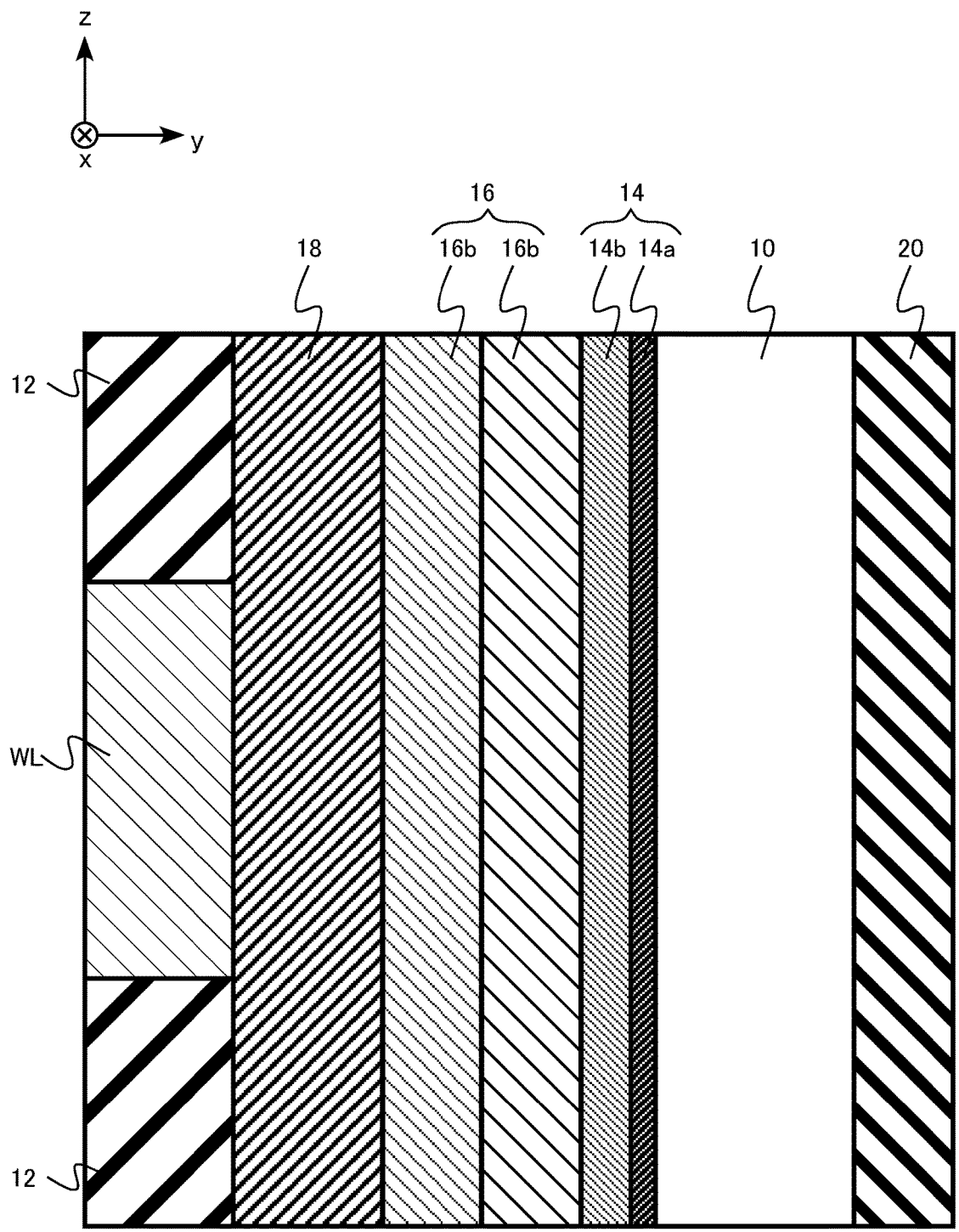
FIG. 21 is a schematic cross-sectional view of a memory cell of a semiconductor memory device according to a modified example of the first embodiment.

FIG. 21 is a schematic cross-sectional view of a memory cell of a semiconductor memory device according to a modified example of the first embodiment. FIG. 21 is an enlarged cross-sectional view of a part of the memory cell. FIG. 21 is a diagram corresponding to FIG. 3.

The memory cell according to the modified example is different from the memory cell according to the first embodiment only in that the tunnel insulating layer 14 does not have the upper layer portion 14c. Also in the memory cell according to the modified example, it is possible to obtain the same functions and effects as those of the memory cell according to the first embodiment.

As described above, according to the first embodiment and the modified example, it is possible to provide the semiconductor memory device capable of implementing an improved charge retention characteristic by decreasing the depth of the trap level of the buffer region 16a.

Second Embodiment

A semiconductor memory device according to a second embodiment is different from the semiconductor memory device according to the first embodiment in that a first insulating layer contains fluorine (F). Hereinafter, a description of contents overlapping with the first embodiment will be partially omitted.

Figure 22:
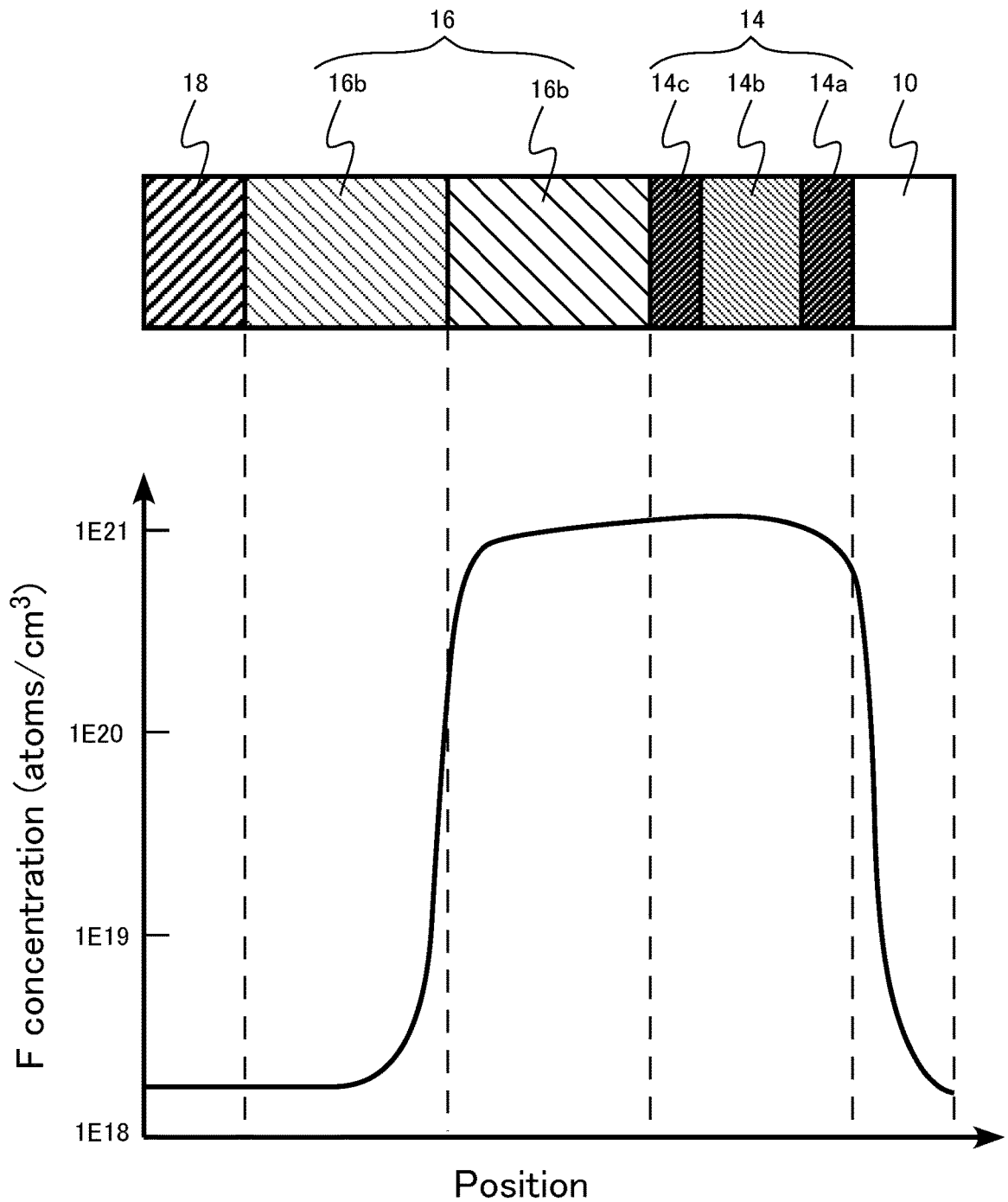
FIG. 22 is a diagram illustrating distribution of fluorine concentrations of a semiconductor memory device according to a second embodiment.

FIG. 22 is a diagram illustrating distribution of fluorine concentrations of the semiconductor memory device according to the second embodiment. FIG. 22 illustrates an example of distribution of fluorine concentrations of a semiconductor layer 10, a tunnel insulating layer 14, a charge storage layer 16, and a block insulating layer 18.

The fluorine concentration of the tunnel insulating layer 14 is higher than a fluorine concentration of a charge storage region 16b. The fluorine concentration of the tunnel insulating layer 14 is higher than the fluorine concentration of the semiconductor layer 10.

The fluorine concentration of the tunnel insulating layer 14 is, for example, equal to or more than $2 \times 10^{20}$ atoms/cm$^3$. An atomic ratio (N/Si) of the tunnel insulating layer 14 is lower than an atomic ratio (N/Si) of the charge storage region 16b, for example.

The semiconductor memory device according to the second embodiment can be manufactured, for example, by diffusing fluorine to the tunnel insulating layer 14 from a side opposite from the charge storage layer 16 after forming the tunnel insulating layer 14.

In a three-dimensional NAND flash memory, there is a failure mode caused by a short charge retention time of a memory cell and a poor charge retention characteristic. For example, there is an initial failure in which data can be retained until verification reading after data is written in the memory cell, but the data is destroyed in the next reading. In addition, for example, there is a data retention failure in which data is destroyed in a short time of the order of milliseconds. Both failures are caused by a short charge retention time of the failed memory cell.

In the semiconductor memory device according to the second embodiment, the tunnel insulating layer 14 contains fluorine. Since the tunnel insulating layer 14 contains fluorine, a memory cell having a short charge retention time is reduced. Therefore, the initial failure and the short-time data retention failure are reduced.

For example, it is considered that a trap level of the tunnel insulating layer is shallow in the memory cell having a short charge retention time. Then, it is considered that electrons trapped in the shallow trap level are trapped in a short time, thereby causing the initial failure or the short-time data retention failure.

According to the second embodiment, fluorine is contained in the tunnel insulating layer, such that the shallow trap level causing the failure is changed to an extremely shallow trap level. By further decreasing a depth of the shallow trap level causing the failure, it is possible to extremely shorten a time until electrons are trapped.

Therefore, for example, detrapping of electrons occurs between the writing of data in the memory cell and the verification reading. Therefore, a state similar to that in a case where a shallow trap level is not present in the band gap is achieved in appearance. Therefore, the initial failure and the short-time data retention failure are reduced.

From the viewpoint of decreasing a depth of the trap level of the tunnel insulating layer 14, the fluorine concentration of the tunnel insulating layer 14 is preferably equal to or more than $2 \times 10^{20}$ atoms/cm$^3$, and more preferably, equal to or more than $5 \times 10^{20}$ atoms/cm$^3$.

From the viewpoint of promoting diffusion of fluorine in the tunnel insulating layer 14, a first atomic ratio (N/Si) of nitrogen (N) to silicon (Si) in the tunnel insulating layer 14 is preferably equal to or less than 1.25, and more preferably, equal to or less than 1.10.

From the viewpoint of decreasing the depth of the trap level of the tunnel insulating layer 14, the tunnel insulating layer 14 preferably contains oxygen (O). The tunnel insulating layer 14 preferably contains silicon oxynitride. An intermediate portion 14b is preferably silicon oxynitride.

As described above, according to the second embodiment, similarly to the first embodiment, it is possible to provide the semiconductor memory device capable of implementing an improved charge retention characteristic.

Third Embodiment

A semiconductor memory device of a third embodiment is different from the semiconductor memory device according to the first embodiment in that a second insulating layer is provided between a first gate electrode layer and a third insulating layer. Hereinafter, a description of contents overlapping with the first embodiment will be partially omitted.

Figure 23A:
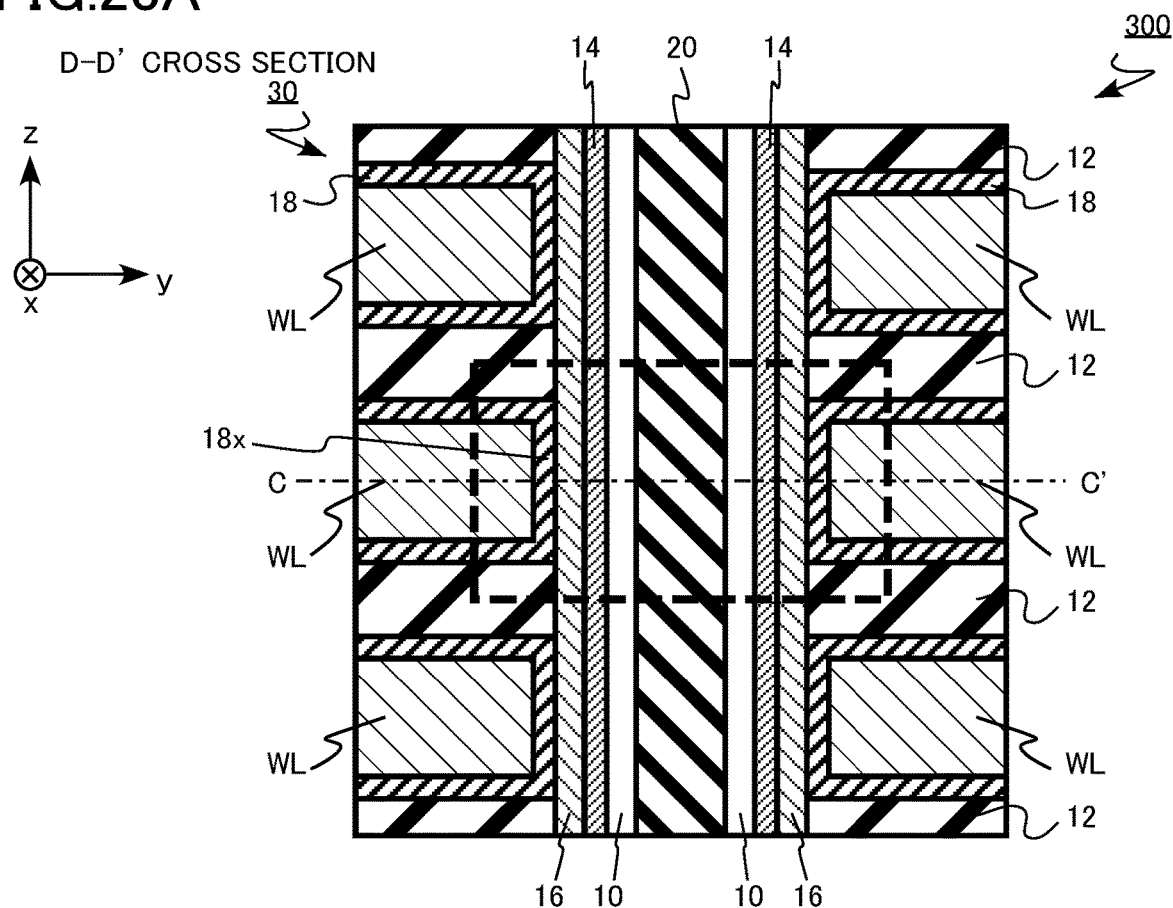
FIGS. 23A and 23B are schematic cross-sectional views of a memory cell array of a semiconductor memory device according to a third embodiment.
Figure 23B:
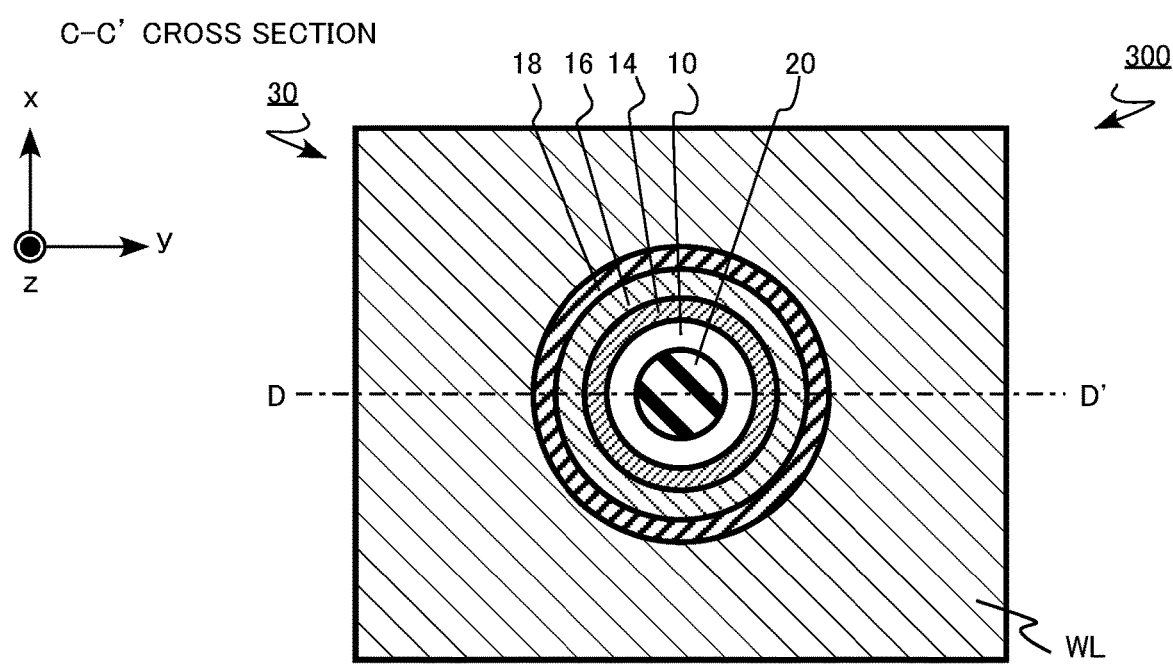

FIGS. 23A and 23B are schematic cross-sectional views of a memory cell array of the semiconductor memory device according to the third embodiment. FIG. 23A is a yz cross-sectional view of a memory cell array 300. FIG. 23A illustrates a cross section taken along D-D' of FIG. 23B. FIG. 23B is an xy cross-sectional view of the memory cell array 300. FIG. 23B illustrates a cross section taken along C-C' of FIG. 23A. In FIG. 23A, a region surrounded by a broken line is one memory cell. FIGS. 23A and 23B are views corresponding to FIGS. 2A and 2B according to the first embodiment.

A block insulating layer 18 is provided between a word line WL and an interlayer insulating layer 12. The word line WL is an example of the first gate electrode layer. The interlayer insulating layer 12 is an example of a third insulating layer. The block insulating layer 18 is an example of the second insulating layer.

The block insulating layer 18 is provided on and under the word line WL. The block insulating layer 18 is not provided between the interlayer insulating layer 12 and a semiconductor layer 10. The interlayer insulating layer 12 is in contact with a charge storage layer 16.

In the semiconductor memory device according to the third embodiment, since the block insulating layer 18 is not present between the interlayer insulating layer 12 and the semiconductor layer 10, electrons are less likely to be accumulated in the charge storage layer 16 between the interlayer insulating layer 12 and the semiconductor layer 10. Therefore, lateral migration of electrons is suppressed. In addition, variation in data amount of the memory cell is suppressed.

As described above, according to the third embodiment, similarly to the first embodiment, it is possible to provide the semiconductor memory device capable of implementing an improved charge retention characteristic.

Fourth Embodiment

A semiconductor memory device according to a fourth embodiment is different from the semiconductor memory device according to the first embodiment in that a second insulating layer is provided between a semiconductor layer and a third insulating layer and further has a second portion containing a paraelectric material. In addition, the semiconductor memory device according to the fourth embodiment is different from the semiconductor memory device according to the first embodiment in that the second insulating layer is provided between the semiconductor layer and the third insulating layer, and a main constituent substance of the second portion is a crystal other than crystals of an orthorhombic crystal system and a trigonal crystal system. Hereinafter, a description of contents overlapping with the first embodiment will be partially omitted.

Figure 24A:
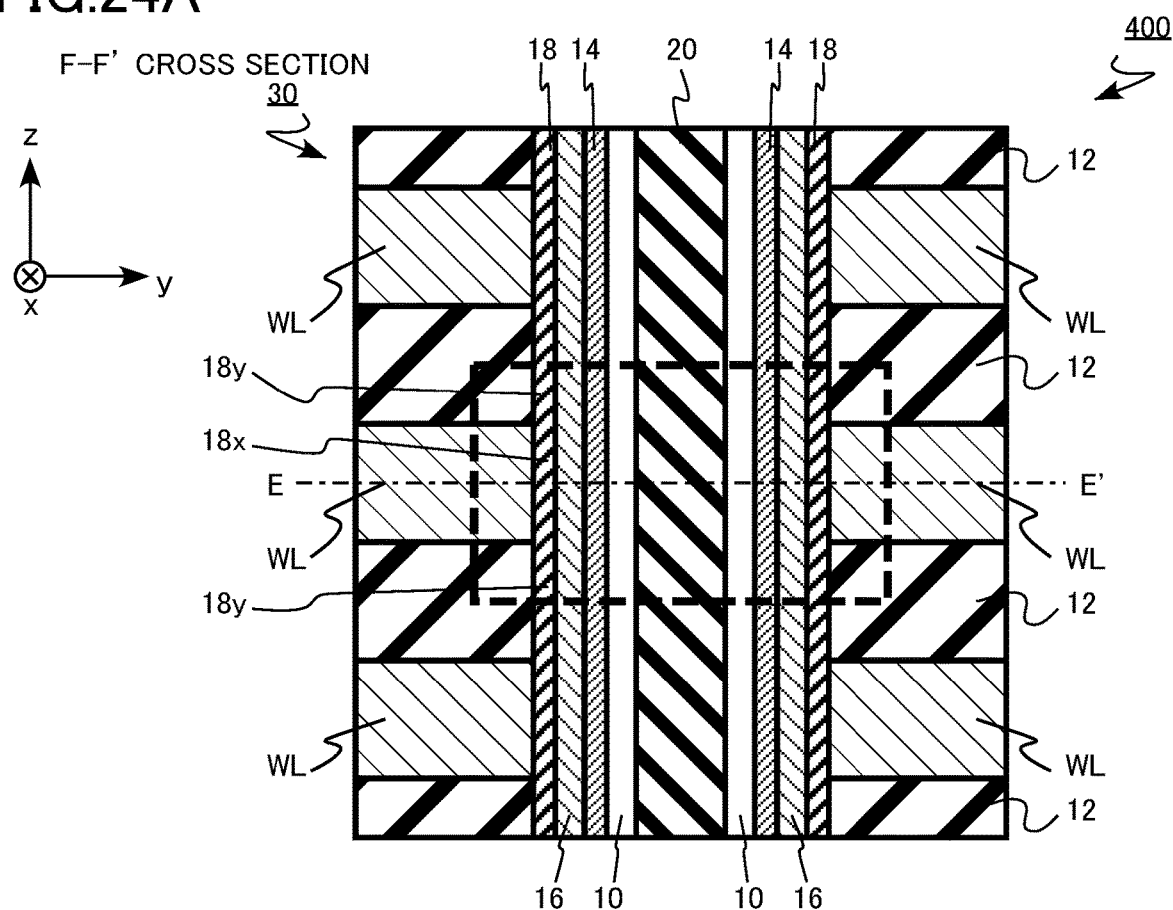
FIGS. 24A and 24B are schematic cross-sectional views of a memory cell array of a semiconductor memory device according to a fourth embodiment.
Figure 24B:
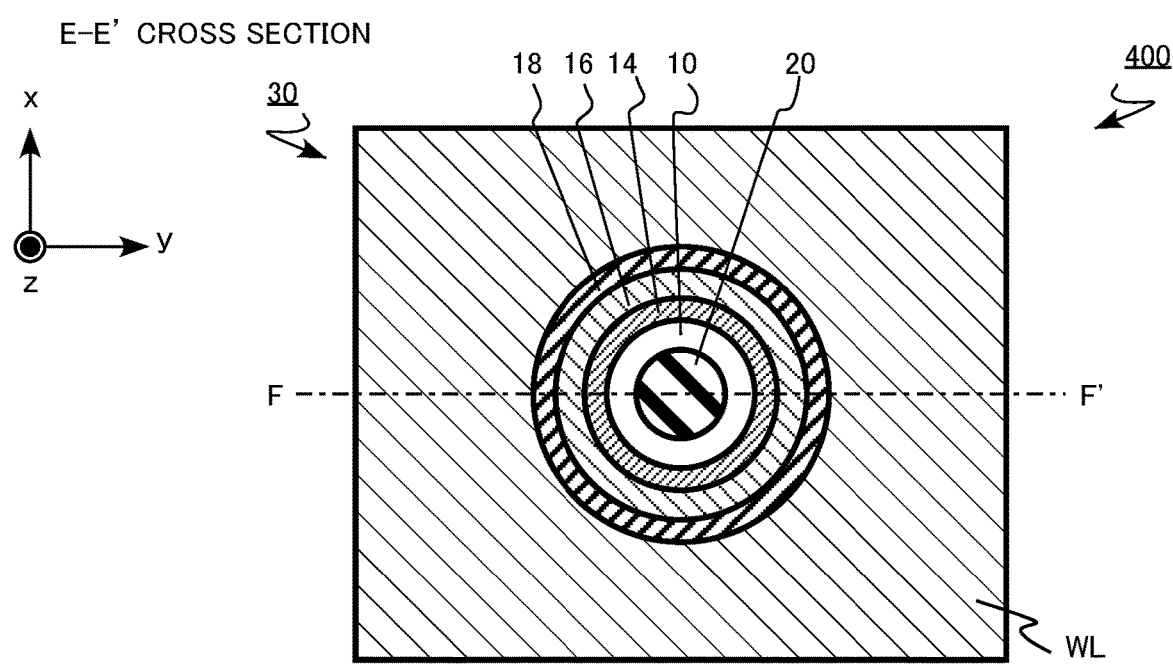

FIGS. 24A and 24B are schematic cross-sectional views of a memory cell array of the semiconductor memory device according to the fourth embodiment. FIG. 24A is a yz cross-sectional view of a memory cell array 400. FIG. 24A illustrates a cross section taken along F-F' of FIG. 24B. FIG. 24B is an xy cross-sectional view of the memory cell array 400. FIG. 24B illustrates a cross section taken along E-E' of FIG. 24A. In FIG. 24A, a region surrounded by a broken line is one memory cell. FIGS. 24A and 24B are views corresponding to FIGS. 2A and 2B according to the first embodiment.

A first portion 18x of a block insulating layer 18 includes a ferroelectric material. The first portion 18x has ferroelectricity.

The first portion 18x of the block insulating layer 18 contains, for example, at least one metal element of hafnium (Hf) or zirconium (Zr), and oxygen (O). The first portion 18x of the block insulating layer 18 is formed of, for example, a crystal of the orthorhombic crystal system or the trigonal crystal system as a main constituent substance.

A second portion 18y of the block insulating layer 18 contains a paraelectric material. The second portion 18y has paraelectricity.

The second portion 18y of the block insulating layer 18 contains, for example, at least one metal element of hafnium (Hf) or zirconium (Zr), and oxygen (O). The second portion 18y of the block insulating layer 18 is formed of a crystal other than crystals of the orthorhombic crystal system and the trigonal crystal system as a main constituent substance.

An interlayer insulating layer 12 contains, for example, aluminum (Al) and oxygen (O). The interlayer insulating layer 12 contains, for example, aluminum oxide. The interlayer insulating layer 12 is, for example, aluminum oxide.

For example, by using aluminum oxide as the interlayer insulating layer 12, growth of a crystal of the orthorhombic crystal system and the trigonal crystal system is suppressed in crystallization annealing at the time of manufacturing the semiconductor memory device according to the fourth embodiment.

In the semiconductor memory device according to the fourth embodiment, since the second portion 18y has paraelectricity, electrons are less likely to be accumulated in a charge storage layer 16 between the interlayer insulating layer 12 and the semiconductor layer 10. Therefore, lateral migration of electrons is suppressed. In addition, variation in data amount of the memory cell is suppressed.

As described above, according to the fourth embodiment, similarly to the first embodiment, it is possible to provide the semiconductor memory device capable of implementing an improved charge retention characteristic.

Fifth Embodiment

A semiconductor memory device according to a fifth embodiment is different from the semiconductor memory device according to the first embodiment in that the semiconductor memory device is a two-dimensional NAND flash memory. Hereinafter, a description of contents overlapping with the first embodiment will be partially omitted.

The semiconductor memory device according to the fifth embodiment is a two-dimensional NAND flash memory. A memory cell of the semiconductor memory device according to the fifth embodiment is a memory cell of the so-called MONOS type.

Figure 25:
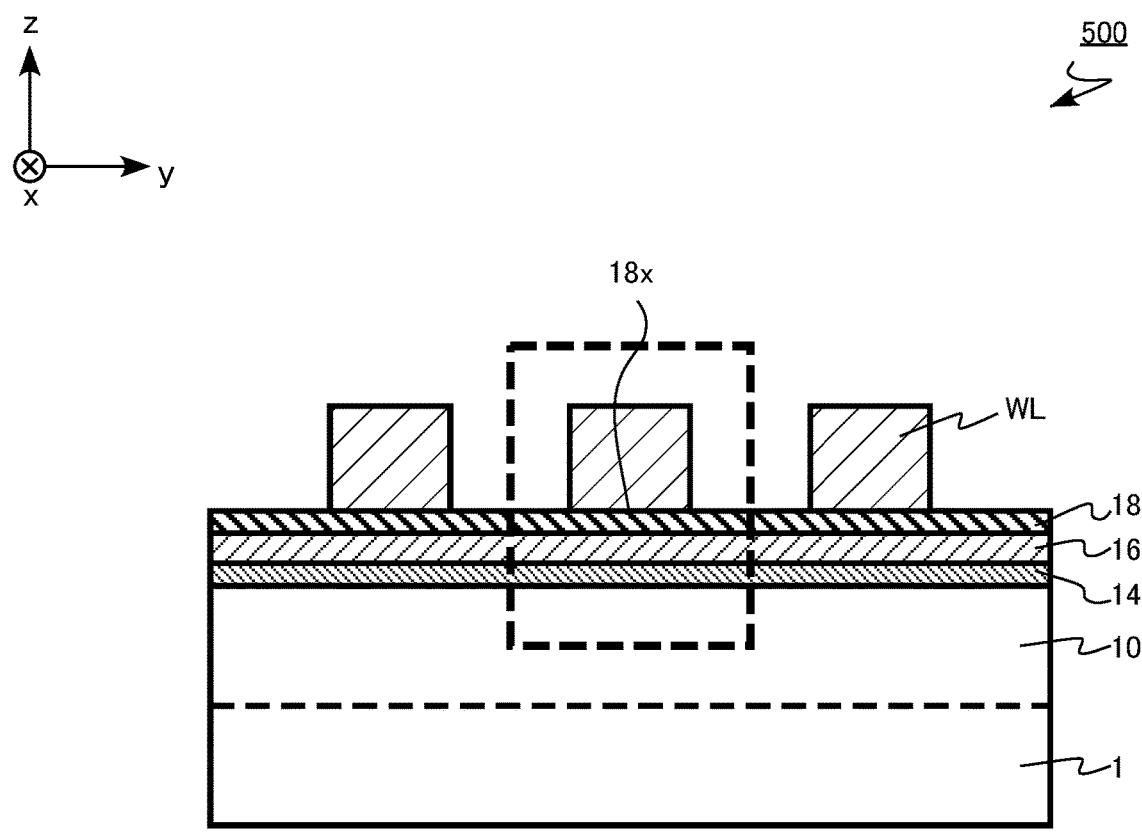
FIG. 25 is a schematic cross-sectional view of a memory cell array of a semiconductor memory device according to a fifth embodiment.

FIG. 25 is a schematic cross-sectional view of a memory cell array of the semiconductor memory device according to the fifth embodiment. FIG. 25 is a yz cross-sectional view of a memory cell array 500. In FIG. 25, a region surrounded by a broken line is one memory cell.

Figure 26:
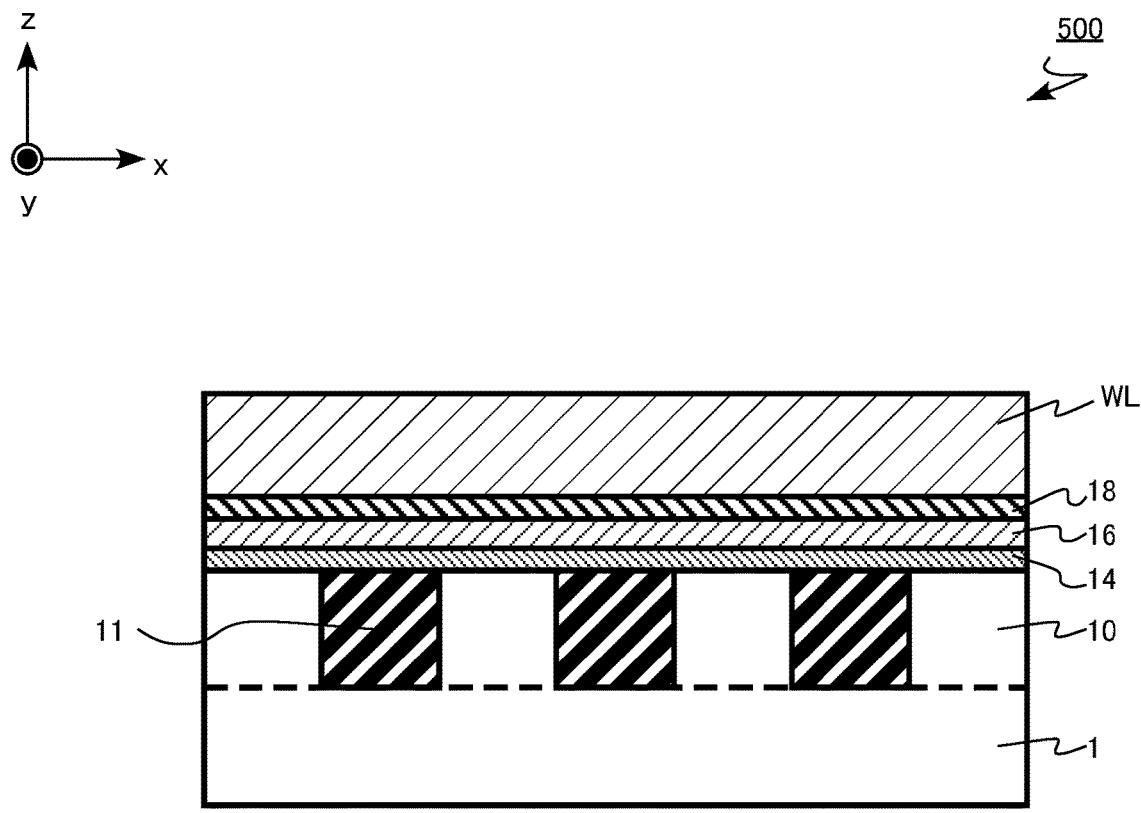
FIG. 26 is a schematic cross-sectional view of the memory cell array of the semiconductor memory device according to the fifth embodiment.

FIG. 26 is a schematic cross-sectional view of the memory cell array of the semiconductor memory device according to the fifth embodiment. FIG. 26 is an xz cross-sectional view of the memory cell array 500.

Figure 27:
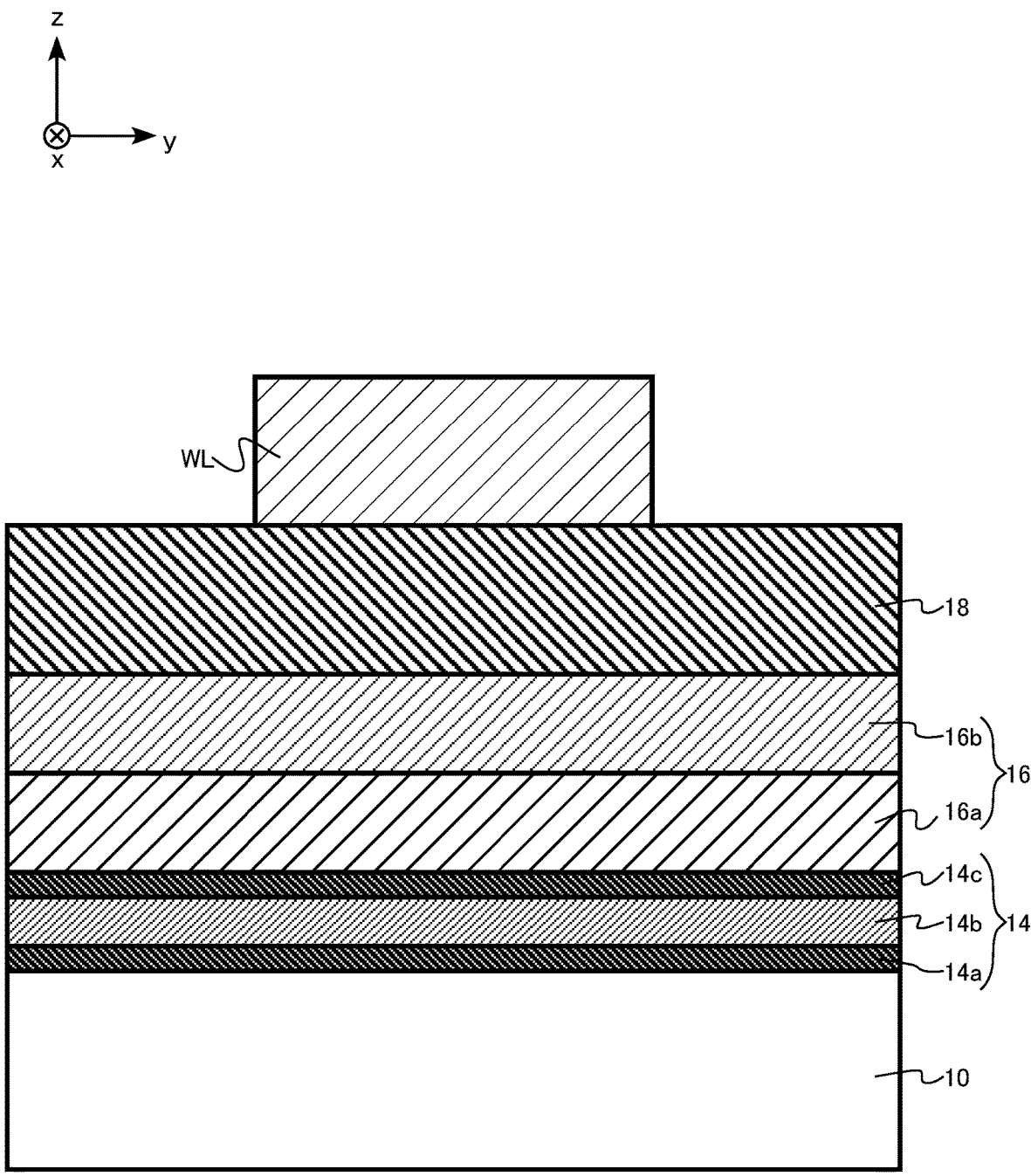
FIG. 27 is a schematic cross-sectional view of a memory cell of the semiconductor memory device according to the fifth embodiment.

FIG. 27 is a schematic cross-sectional view of a memory cell of the semiconductor memory device according to the fifth embodiment. FIG. 27 is an enlarged cross-sectional view of a part of the memory cell.

As illustrated in FIGS. 25 and 26, the memory cell array 500 includes a plurality of word lines WL, a semiconductor substrate 1, a semiconductor layer 10, an element isolation region 11, a tunnel insulating layer 14, a charge storage layer 16, and a block insulating layer 18.

The tunnel insulating layer 14 has the lower layer portion 14a, the intermediate portion 14b, and the upper layer portion 14c. The charge storage layer 16 has a buffer region 16a and a charge storage region 16b. The block insulating layer 18 has a first portion 18x.

Hereinafter, the x direction is defined as a second direction, the y direction is defined as a first direction, and the z direction is defined as a third direction. The x direction, the y direction, and the z direction intersect each other, and are, for example, perpendicular to each other.

One of the plurality of word lines WL is an example of the first gate electrode layer. Another one of the plurality of word lines WL is an example of the second gate electrode layer. The second gate electrode layer is provided apart from the first gate electrode layer in the y direction.

The tunnel insulating layer 14 is an example of the first insulating layer. The block insulating layer 18 is an example of the second insulating layer. The charge storage layer 16 is an example of the first layer. The buffer region 16a is an example of the first region. The charge storage region 16b is an example of the second region.

The semiconductor substrate 1 is, for example, a single crystal semiconductor. The semiconductor substrate 1 is, for example, single crystal silicon.

The semiconductor layer 10 is provided on the semiconductor substrate 1. The semiconductor layer 10 extends in the y direction. The semiconductor layer 10 is, for example, a single crystal semiconductor. The semiconductor layer 10 is, for example, single crystal silicon. The semiconductor layer 10 functions as a channel of the memory cell transistor MT.

The element isolation region 11 is provided on the semiconductor substrate 1. The element isolation region 11 is provided between two semiconductor layers 10. The element isolation region 11 is, for example, silicon oxide.

The tunnel insulating layer 14 is provided on the semiconductor layer 10. The tunnel insulating layer 14 is provided between the semiconductor layer 10 and at least one of the plurality of word lines WL. The tunnel insulating layer 14 is provided between the semiconductor layer 10 and the charge storage layer 16.

The tunnel insulating layer 14 contains, for example, silicon (Si), nitrogen (N), and oxygen (O).

The tunnel insulating layer 14 has the lower layer portion 14a, the intermediate portion 14b, and the upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The charge storage layer 16 is provided between the tunnel insulating layer 14 and the block insulating layer 18. The charge storage layer 16 contains silicon (Si), nitrogen (N), and fluorine (F).

The charge storage layer 16 has a buffer region 16a and a charge storage region 16b. The charge storage region 16b is provided between the buffer region 16a and the block insulating layer 18. The charge storage region 16b is in contact with the block insulating layer 18.

The buffer region 16a contains silicon (Si), nitrogen (N), and fluorine (F). The charge storage region 16b contains silicon (Si) and nitrogen (N). The charge storage region 16b contains or does not contain fluorine (F). A fluorine concentration of the buffer region 16a is higher than a fluorine concentration of the charge storage region 16b.

A second atomic ratio (N/Si) of nitrogen (N) to silicon (Si) in the charge storage region 16b is higher than a first atomic ratio (N/Si) of nitrogen (N) to silicon (Si) in the buffer region 16a.

The block insulating layer 18 is provided between the tunnel insulating layer 14 and the word line WL. The block insulating layer 18 is provided between the charge storage layer 16 and the word line WL.

The block insulating layer 18 contains a ferroelectric material. The block insulating layer 18 is a ferroelectric layer. The block insulating layer 18 has ferroelectricity.

The block insulating layer 18 contains, for example, at least one metal element of hafnium (Hf) or zirconium (Zr), and oxygen (O). The block insulating layer 18 is formed of, for example, a crystal of the orthorhombic crystal system or the trigonal crystal system as a main constituent substance.

The word line WL is provided on the block insulating layer 18. The word line WL extends in the x direction. The word lines WL are repeatedly disposed apart from each other in the y direction. The word line WL functions as a control electrode of a memory cell transistor.

As described above, according to the fifth embodiment, similarly to the first embodiment, it is possible to provide the semiconductor memory device capable of implementing an improved charge retention characteristic.

Sixth Embodiment

A semiconductor memory device according to a sixth embodiment is different from the semiconductor memory device according to the first embodiment in that a semiconductor layer extends in a direction parallel to a surface of a semiconductor substrate. Hereinafter, a description of contents overlapping with the first embodiment will be partially omitted.

The semiconductor memory device according to the sixth embodiment is a three-dimensional NAND flash memory. A memory cell of the semiconductor memory device according to the sixth embodiment is a memory cell of the so-called MONOS type.

Figure 28:
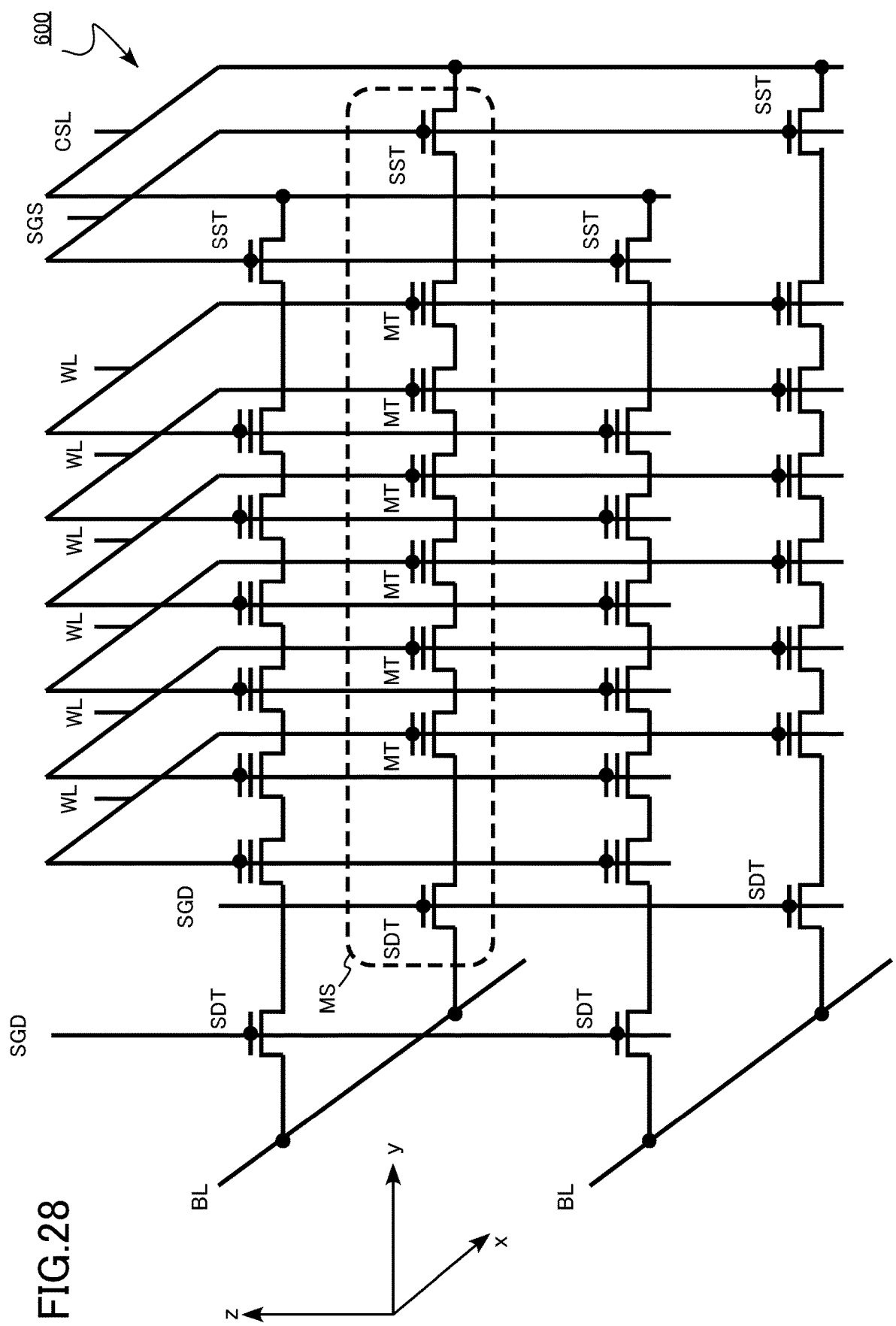
FIG. 28 is a circuit diagram of a memory cell array of a semiconductor memory device according to a sixth embodiment.

FIG. 28 is a circuit diagram of a memory cell array of the semiconductor memory device according to the sixth embodiment.

As illustrated in FIG. 28, a memory cell array 600 of the three-dimensional NAND flash memory according to the sixth embodiment includes a plurality of word lines WL, a common source line CSL, a source selection gate line SGS, a plurality of drain selection gate lines SGD, a plurality of bit lines BL, and a plurality of memory strings MS. The word line WL is an example of a gate electrode layer.

The plurality of word lines WL are disposed apart from each other in the y direction. The plurality of memory strings MS extend in the y direction. The plurality of bit lines BL extend in an x direction, for example.

Hereinafter, the x direction is defined as a second direction, the y direction is defined as a first direction, and the z direction is defined as a third direction. The x direction, the y direction, and the z direction intersect each other, and are, for example, perpendicular to each other.

As illustrated in FIG. 28, the memory string MS includes a source selection transistor SST, a plurality of memory cells, and a drain selection transistor SDT connected in series between the common source line CSL and the bit line BL. One memory string MS is selected by selecting one bit line BL and one drain selection gate line SGD, and one memory cell can be selected by selecting one word line WL. The word line WL functions as a gate electrode of a memory cell transistor MT constituting the memory cell.

Figure 29:
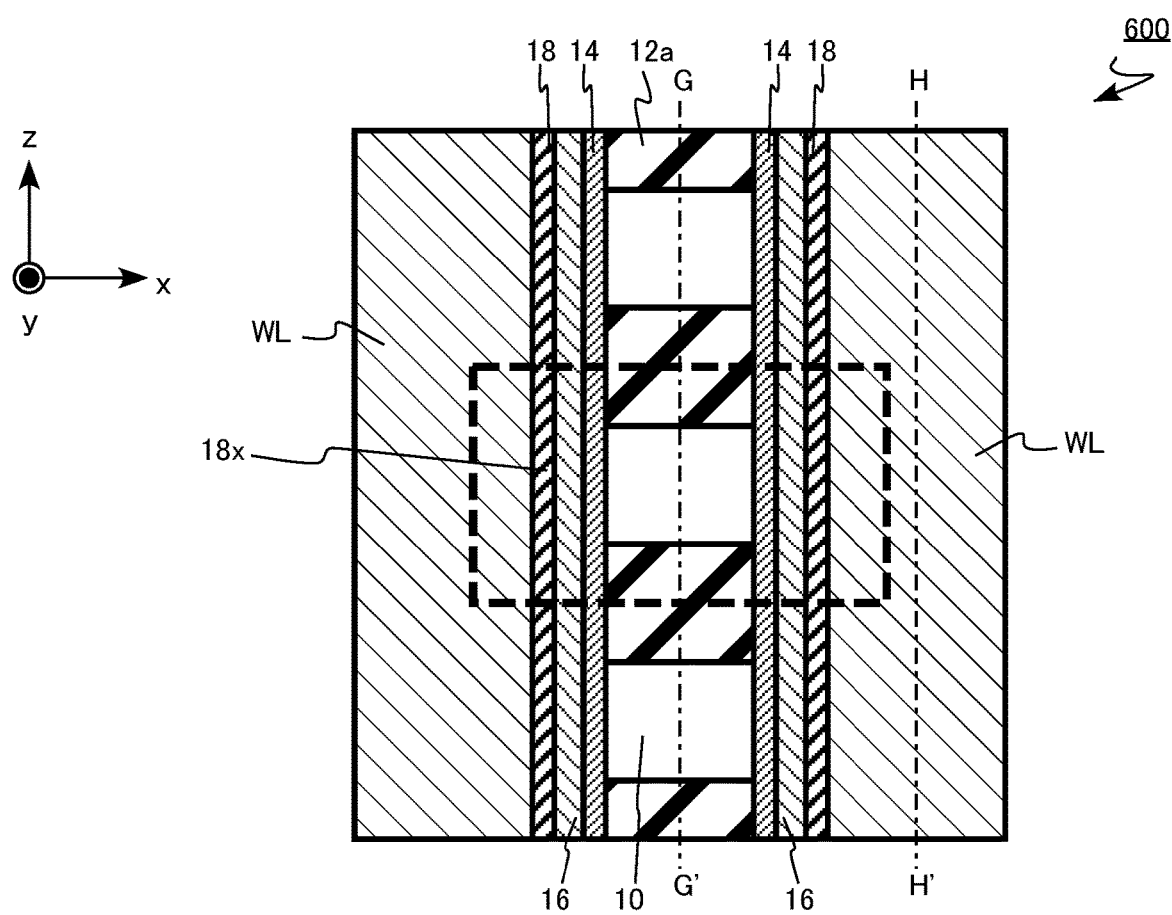
FIG. 29 is a schematic cross-sectional view of the memory cell array of the semiconductor memory device according to the sixth embodiment.
Figure 30A:
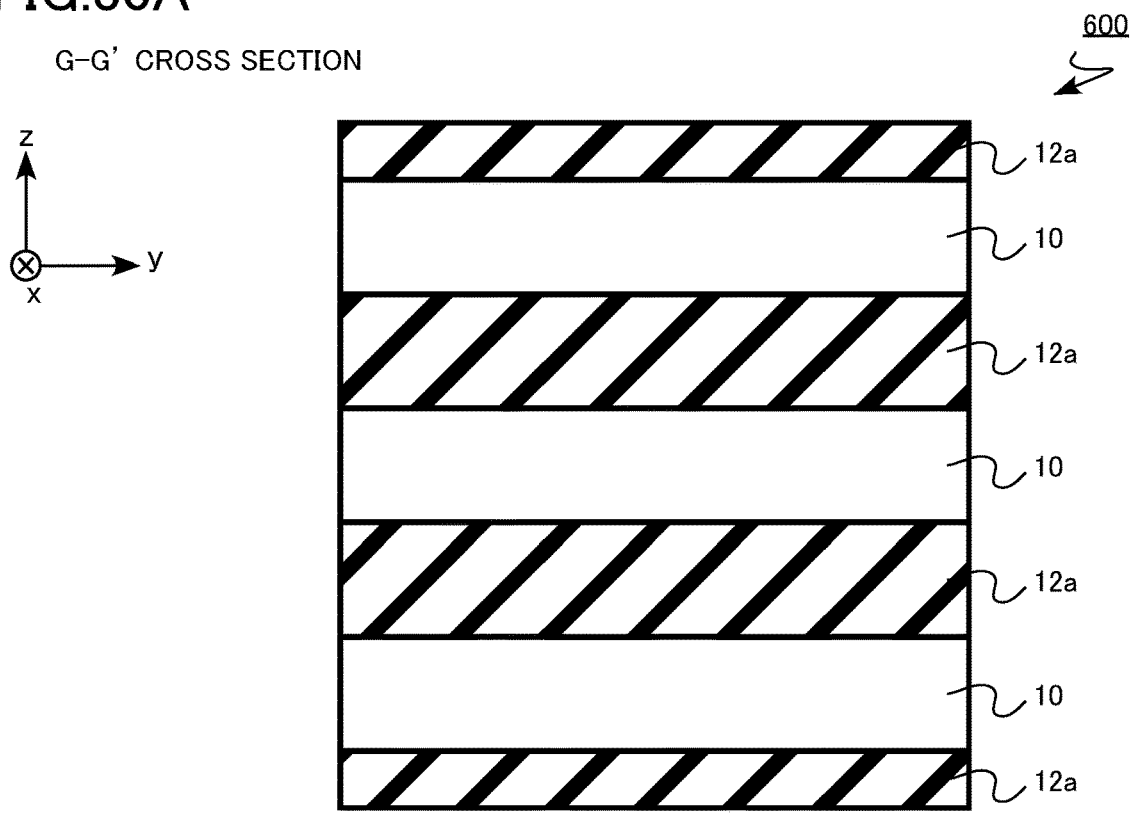
FIGS. 30A and 30B are schematic cross-sectional views of the memory cell array of the semiconductor memory device according to the sixth embodiment.
Figure 30B:
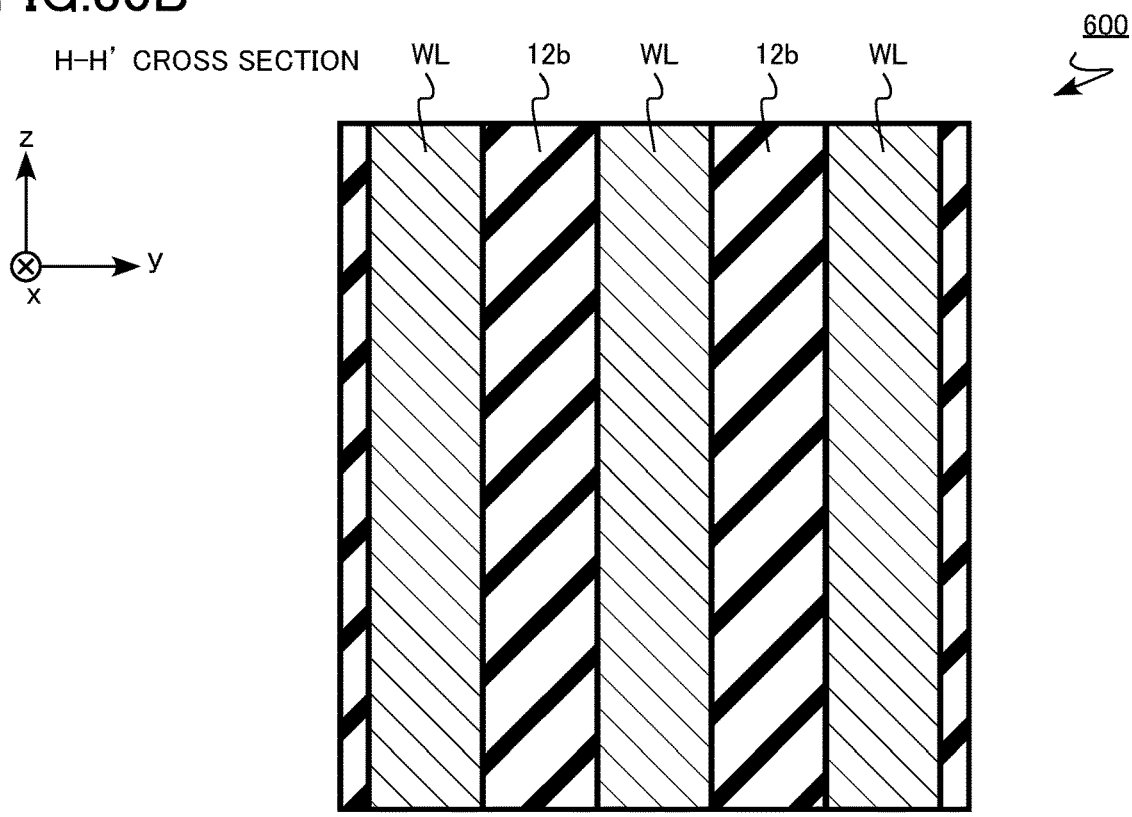

FIGS. 29, 30A, and 30B are schematic cross-sectional views of the memory cell array of the semiconductor memory device according to the sixth embodiment. FIGS. 29, 30A, and 30B illustrate cross sections of the plurality of memory cells in one memory string MS surrounded by a dotted line, for example, in the memory cell array 600 of FIG. 29.

FIG. 29 is an xz cross-sectional view of the memory cell array 600. In FIG. 29, a region surrounded by a broken line is one memory cell. FIG. 30A illustrates a cross section taken along G-G' of FIG. 29. FIG. 30A is a yz cross-sectional view of the memory cell array 600. FIG. 30B illustrates a cross section taken along H-H' of FIG. 29. FIG. 30B is a yz cross-sectional view of the memory cell array 600.

Figure 31:
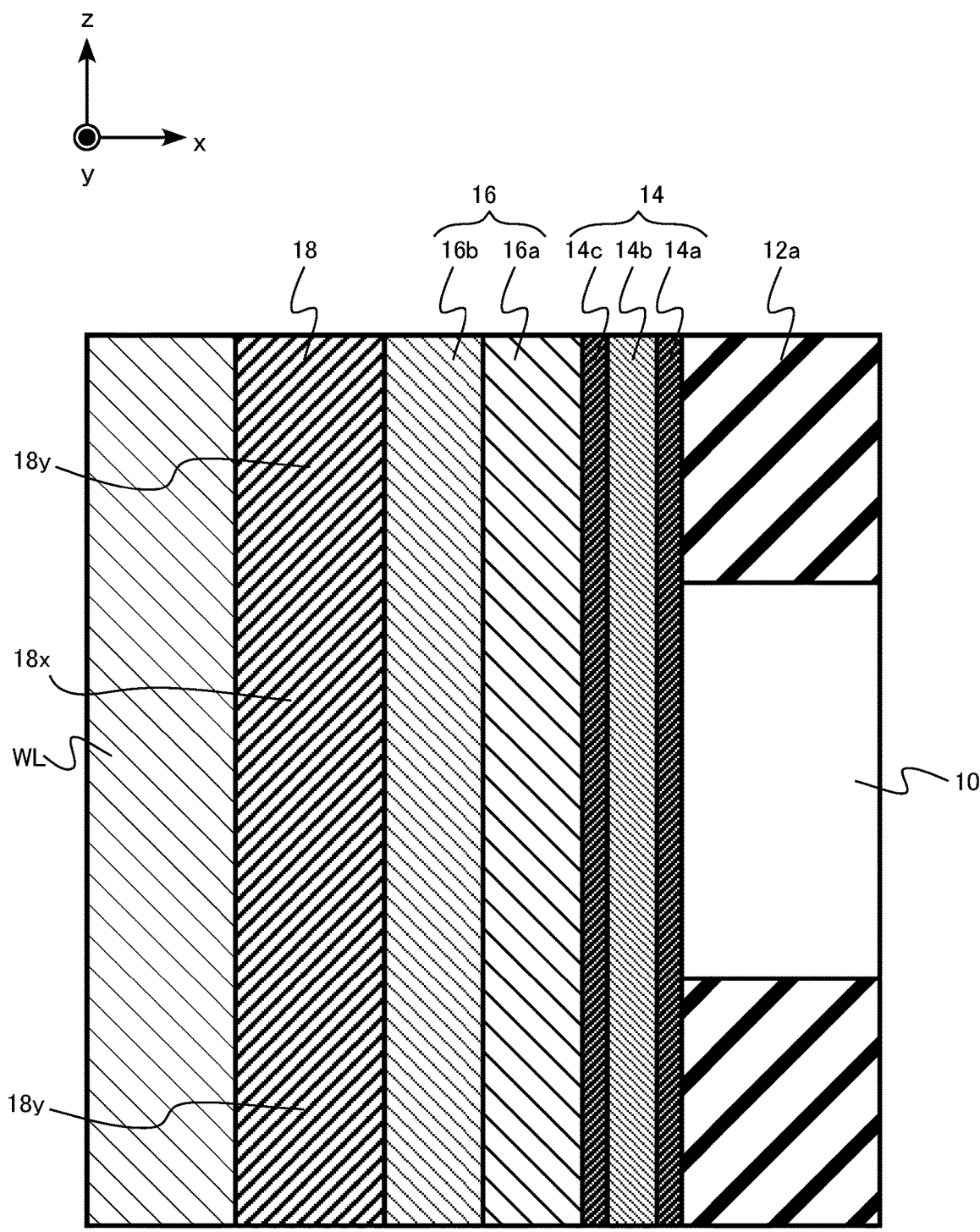
FIG. 31 is a schematic cross-sectional view of a memory cell of the semiconductor memory device according to the sixth embodiment.

FIG. 31 is a schematic cross-sectional view of a memory cell of the semiconductor memory device according to the sixth embodiment. FIG. 31 is an enlarged cross-sectional view of a part of the memory cell.

As illustrated in FIGS. 29, 30A, and 30B, the memory cell array 600 includes a plurality of word lines WL, a semiconductor layer 10, an interlayer insulating layer 12a, an interlayer insulating layer 12b, a tunnel insulating layer 14, a charge storage layer 16, and a block insulating layer 18.

The tunnel insulating layer 14 has the lower layer portion 14a, the intermediate portion 14b, and the upper layer portion 14c. The charge storage layer 16 has a buffer region 16a and a charge storage region 16b. The block insulating layer 18 has a first portion 18x.

One of the plurality of word lines WL is an example of the first gate electrode layer. Another one of the plurality of word lines WL is an example of the second gate electrode layer. The second gate electrode layer is provided apart from the first gate electrode layer in the y direction.

The interlayer insulating layer 12b is an example of the third insulating layer. The tunnel insulating layer 14 is an example of the first insulating layer. The block insulating layer 18 is an example of the second insulating layer. The charge storage layer 16 is an example of the first layer. The buffer region 16a is an example of the first region. The charge storage region 16b is an example of the second region.

The memory cell array 600 is provided, for example, on a semiconductor substrate (not illustrated). The semiconductor substrate has a surface parallel to the x direction and the y direction.

The word lines WL and the interlayer insulating layers 12b are alternately disposed in the y direction on the semiconductor substrate. The word lines WL are disposed apart from each other in the y direction. The word lines WL are repeatedly disposed apart from each other in the y direction. The word line WL functions as a control electrode of the memory cell transistor MT.

The interlayer insulating layer 12b isolates the word lines WL from each other. The interlayer insulating layer 12b electrically isolates the word lines WL from each other. The interlayer insulating layer 12a isolates the semiconductor layers 10 from each other. The interlayer insulating layer 12a electrically isolates the semiconductor layers 10 from each other.

The interlayer insulating layer 12a and the interlayer insulating layer 12b are, for example, an oxide, an oxynitride, or a nitride. The interlayer insulating layer 12a and the interlayer insulating layer 12b are, for example, silicon oxide. A thickness of the interlayer insulating layer 12a in the z direction is, for example, equal to or more than 5 nm and equal to or less than 20 nm. A thickness of the interlayer insulating layer 12b in the y direction is, for example, equal to or more than 5 nm and equal to or less than 20 nm.

The semiconductor layer 10 extends in the y direction. The semiconductor layer 10 extends in a direction parallel to the surface of the semiconductor substrate. The semiconductor layer 10 is interposed between the plurality of word lines WL. The semiconductor layer 10 has, for example, a quadrangular prism shape. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the word line WL. The tunnel insulating layer 14 is provided between the semiconductor layer 10 and at least one of the plurality of word lines WL. The tunnel insulating layer 14 is provided between the semiconductor layer 10 and the charge storage layer 16.

The tunnel insulating layer 14 contains, for example, silicon (Si), nitrogen (N), and oxygen (O). The tunnel insulating layer 14 contains, for example, silicon nitride or silicon oxynitride.

The tunnel insulating layer 14 has the lower layer portion 14a, the intermediate portion 14b, and the upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The lower layer portion 14a is, for example, silicon oxide. The intermediate portion 14b is, for example, silicon nitride or silicon oxynitride. The upper layer portion 14c is, for example, silicon oxide.

The charge storage layer 16 is provided between the tunnel insulating layer 14 and the block insulating layer 18. The charge storage layer 16 contains silicon (Si), nitrogen (N), and fluorine (F). The charge storage layer 16 contains, for example, silicon nitride.

The charge storage layer 16 has a buffer region 16a and a charge storage region 16b. The charge storage region 16b is provided between the buffer region 16a and the block insulating layer 18. The charge storage region 16b is in contact with the block insulating layer 18.

The buffer region 16a contains silicon (Si), nitrogen (N), and fluorine (F). The charge storage region 16b contains silicon (Si) and nitrogen (N). The charge storage region 16b contains or does not contain fluorine (F). A fluorine concentration of the buffer region 16a is higher than a fluorine concentration of the charge storage region 16b.

A second atomic ratio (N/Si) of nitrogen (N) to silicon (Si) in the charge storage region 16b is higher than a first atomic ratio (N/Si) of nitrogen (N) to silicon (Si) in the buffer region 16a.

The block insulating layer 18 is provided between the tunnel insulating layer 14 and the word line WL. The block insulating layer 18 is provided between the charge storage layer 16 and the word line WL.

The block insulating layer 18 has a first portion 18x and a second portion 18y. The first portion 18x is a portion disposed between the word line WL and the semiconductor layer 10. The second portions 18y are disposed in the z direction with respect to the first portion 18x. The first portion 18x is interposed between the second portions 18y.

The block insulating layer 18 contains a ferroelectric material. The block insulating layer 18 is a ferroelectric layer. The block insulating layer 18 has ferroelectricity.

The first portion 18x contains the ferroelectric material. The first portion 18x has ferroelectricity. The second portion 18y contains the ferroelectric material. The second portion 18y has ferroelectricity.

The block insulating layer 18 contains, for example, at least one metal element of hafnium (Hf) or zirconium (Zr), and oxygen (O). The block insulating layer 18 contains, for example, at least one of hafnium oxide or zirconium oxide.

The first portion 18x of the block insulating layer 18 contains, for example, at least one metal element of hafnium (Hf) or zirconium (Zr), and oxygen (O). The first portion 18x of the block insulating layer 18 is formed of, for example, a crystal of the orthorhombic crystal system or the trigonal crystal system as a main constituent substance.

As described above, according to the sixth embodiment, similarly to the first embodiment, it is possible to provide the semiconductor memory device capable of implementing an improved charge retention characteristic.

In the first to fourth embodiments, a case where the interlayer insulating layer 12 is provided between the word lines WL has been described as an example, but a space between the word lines WL may be, for example, a cavity.

In the first to fourth embodiments, the structure in which the semiconductor layer 10 is surrounded by the word lines WL has been described as an example, but the semiconductor layer 10 may be interposed between two divided word lines WL. In this structure, the number of memory cells in the stacked body 30 can be doubled.

Furthermore, in the first to fourth embodiments, the structure in which one semiconductor layer 10 is provided in one memory hole 54 has been described as an example, but a structure in which a plurality of semiconductor layers 10 divided into two or more are provided in one memory hole 54 can also be adopted. In this structure, the number of memory cells in the stacked body 30 can be doubled or more.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor layer extending in a first direction;
a first gate electrode layer;
a first insulating layer provided between the semiconductor layer and the first gate electrode layer;
a second insulating layer provided between the first insulating layer and the first gate electrode layer, and the second insulating layer including a first portion containing a ferroelectric material; and
a first layer provided between the first insulating layer and the second insulating layer, the first layer containing silicon (Si), nitrogen (N), and fluorine (F), the first layer including a first region and a second region provided between the first region and the second insulating layer, a second atomic ratio (N/Si) of nitrogen (N) to silicon (Si) in the second region being higher than a first atomic ratio (N/Si) of nitrogen (N) to silicon (Si) in the first region, and a first fluorine concentration in the first region being higher than a second fluorine concentration in the second region.

2. The semiconductor memory device according to claim 1, wherein the first atomic ratio is equal to or less than 1.25, and the second atomic ratio is more than 1.25.

3. The semiconductor memory device according to claim 1, wherein the first fluorine concentration is equal to or more than $2\times10^{20}$ atoms/cm$^3$, and the second fluorine concentration is equal to or less than $1\times10^{20}$ atoms/cm$^3$.

4. The semiconductor memory device according to claim 1, wherein the first insulating layer contains silicon (Si), nitrogen (N), and oxygen (O).

5. The semiconductor memory device according to claim 4, wherein the first insulating layer contains fluorine (F).

6. The semiconductor memory device according to claim 1, wherein the second insulating layer contains oxygen (O) and at least one metal element of hafnium (Hf) or zirconium (Zr).

7. The semiconductor memory device according to claim 1, wherein the second region is in contact with the second insulating layer.

8. The semiconductor memory device according to claim 1, further comprising:
a second gate electrode layer provided apart from the first gate electrode layer in the first direction; and
a third insulating layer provided between the first gate electrode layer and the second gate electrode layer.

9. The semiconductor memory device according to claim 8, wherein the second insulating layer is provided between the first gate electrode layer and the third insulating layer.

10. The semiconductor memory device according to claim 8, wherein the second insulating layer further includes a second portion provided between the semiconductor layer and the third insulating layer, and the second portion contains a paraelectric material.

11. A semiconductor memory device comprising:
a semiconductor layer extending in a first direction;
a first gate electrode layer;
a first insulating layer provided between the semiconductor layer and the first gate electrode layer;
a second insulating layer provided between the first insulating layer and the first gate electrode layer, the second insulating layer containing oxygen (O) and at least one metal element of hafnium (Hf) or zirconium (Zr), the second insulating layer including a first portion, and a main constituent substance of the first portion being a crystal of an orthorhombic crystal system or a crystal of a trigonal crystal system; and
a first layer provided between the first insulating layer and the second insulating layer, the first layer containing silicon (Si), nitrogen (N), and fluorine (F), the first layer including a first region and a second region provided between the first region and the second insulating layer, a second atomic ratio (N/Si) of nitrogen (N) to silicon (Si) in the second region being higher than a first atomic ratio (N/Si) of nitrogen (N) to silicon (Si) in the first region, and a first fluorine concentration in the first region being higher than a second fluorine concentration in the second region.

12. The semiconductor memory device according to claim 11, wherein the first atomic ratio is equal to or less than 1.25, and the second atomic ratio is more than 1.25.

13. The semiconductor memory device according to claim 11, wherein the first fluorine concentration is equal to or more than $2\times10^{20}$ atoms/cm$^3$, and the second fluorine concentration is equal to or less than $1\times10^{20}$ atoms/cm$^3$.

14. The semiconductor memory device according to claim 11, wherein the first insulating layer contains silicon (Si), nitrogen (N), and oxygen (O).

15. The semiconductor memory device according to claim 14, wherein the first insulating layer contains fluorine (F).

16. The semiconductor memory device according to claim 11, wherein the first portion contains a ferroelectric material.

17. The semiconductor memory device according to claim 11, wherein the second region is in contact with the second insulating layer.

18. The semiconductor memory device according to claim 11, further comprising:
a second gate electrode layer provided apart from the first gate electrode layer in the first direction; and
a third insulating layer provided between the first gate electrode layer and the second gate electrode layer.

19. The semiconductor memory device according to claim 18, wherein the second insulating layer is provided between the first gate electrode layer and the third insulating layer.

20. The semiconductor memory device according to claim 18, wherein the second insulating layer further includes a second portion provided between the semiconductor layer and the third insulating layer, and a main constituent substance of the second portion is a crystal other than crystals of an orthorhombic crystal system and a trigonal crystal system.

* * * * *